US012666854B2

(12) United States Patent
Liu et al.

(10) Patent No.: US 12,666,854 B2
(45) Date of Patent: Jun. 23, 2026

(54) DISPLAY SUBSTRATE INCLUDING STRETCH HOLE HAVING INORGANIC AND ORGANIC MATERIAL INNER WALL SECTIONS, PREPARATION METHOD THEREOF, AND DISPLAY APPARATUS

(71) Applicant: BOE Technology Group Co., Ltd., Beijing (CN)

(72) Inventors: Mingli Liu, Beijing (CN); Jia Zhao, Beijing (CN); Fangxu Cao, Beijing (CN); Na Bi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 912 days.

(21) Appl. No.: 17/798,896

(22) PCT Filed: Nov. 19, 2021

(86) PCT No.: PCT/CN2021/131591
§ 371 (c)(1),
(2) Date: Aug. 11, 2022

(87) PCT Pub. No.: WO2022/166306
PCT Pub. Date: Aug. 11, 2022

(65) Prior Publication Data
US 2022/0393122 A1      Dec. 8, 2022

(30) Foreign Application Priority Data
Feb. 8, 2021    (CN) .......................... 202110171229.1

(51) Int. Cl.
*H10K 71/80*          (2023.01)
*H10K 59/131*          (2023.01)
(Continued)

(52) U.S. Cl.
CPC ........... *H10K 71/80* (2023.02); *H10K 59/131* (2023.02); *H10K 59/873* (2023.02);
(Continued)

(58) Field of Classification Search
CPC .. H10K 59/131; H10K 59/873; H10K 77/111; G09G 3/3233
See application file for complete search history.

(56) References Cited

U.S. PATENT DOCUMENTS

2019/0207131 A1* 7/2019 Lu ........................ H10K 59/131
2020/0328267 A1  10/2020 Li et al.
(Continued)

FOREIGN PATENT DOCUMENTS

CN          109273515 A       1/2019
CN          110491913 A   * 11/2019   ............. H10K 59/87
(Continued)

OTHER PUBLICATIONS

International Search Report for PCT/CN2021/131591 Mailed Feb. 23, 2022.

*Primary Examiner* — Ida M Soward
(74) *Attorney, Agent, or Firm* — Ling Wu; Stephen Yang; Ling and Yang Intellectual Property

(57)          ABSTRACT

A display substrate and a preparation method thereof, and a display apparatus are provided. The display substrate includes a pixel area and a hole area, the pixel area includes a display structure layer arranged on a base substrate, and the hole area includes a hole structure layer arranged on the base substrate; the hole area includes at least one stretch hole penetrating through the base substrate and the hole structure layer; an inner wall of the stretch hole includes an inorganic material inner wall section and an organic material inner wall section, the inorganic material inner wall section and the organic material inner wall section are arranged along a
(Continued)

direction from the base substrate to the hole structure layer, and the organic material inner wall section is located on a side of the stretch hole away from the hole structure layer.

19 Claims, 11 Drawing Sheets

(51) Int. Cl.
| | | |
|---|---|---|
| *H10K 59/80* | (2023.01) | |
| *H10K 77/10* | (2023.01) | |
| *G09G 3/3233* | (2016.01) | |
| *H10K 59/12* | (2023.01) | |
| *H10K 102/00* | (2023.01) | |

(52) U.S. Cl.
CPC ......... *H10K 77/111* (2023.02); *G09G 3/3233* (2013.01); *G09G 2300/0819* (2013.01); *G09G 2300/0842* (2013.01); *G09G 2310/08* (2013.01); *H10K 59/1201* (2023.02); *H10K 2102/311* (2023.02)

(56) References Cited

U.S. PATENT DOCUMENTS

| | | | |
|---|---|---|---|
| 2020/0365825 A1 * | 11/2020 | Yu ........................ | H10K 59/124 |
| 2022/0123238 A1 | 4/2022 | Song et al. | |
| 2022/0140279 A1 | 5/2022 | Cao et al. | |
| 2022/0393122 A1 | 12/2022 | Liu et al. | |
| 2022/0407023 A1 | 12/2022 | Zhu et al. | |

FOREIGN PATENT DOCUMENTS

| | | | | | |
|---|---|---|---|---|---|
| CN | 111341210 A | * | 6/2020 | .......... | H10K 77/111 |
| CN | 111564482 A | | 8/2020 | | |
| CN | 111864067 A | | 10/2020 | | |
| CN | 112038389 A | * | 12/2020 | .......... | H10K 77/111 |
| CN | 112186023 A | * | 1/2021 | .......... | H10K 59/124 |
| CN | 112259705 A | | 1/2021 | | |
| CN | 112331077 A | | 2/2021 | | |
| CN | 112992995 A | | 6/2021 | | |
| KR | 20200119452 A | * | 10/2020 | ......... | H10K 59/8731 |

* cited by examiner 230   220   210   100

200

300                P        P1 P2  P3    300

300

210              100

Pulling crack          300          2

Laser Lift-
Off (LLO)

An inorganic encapsulation layer failed to
be separated from a glass substrate

DISPLAY SUBSTRATE INCLUDING STRETCH HOLE HAVING INORGANIC AND ORGANIC MATERIAL INNER WALL SECTIONS, PREPARATION METHOD THEREOF, AND DISPLAY APPARATUS

The present application is a U.S. National Phase Entry of International Application No. PCT/CN2021/131591 having an international filing date of Nov. 19, 2021, which claims priority to Chinese Patent Application No. 202110171229.1 filed to the CNIPA on Feb. 8, 2021 and entitled "Display Substrate and Preparation Method thereof, and Display Apparatus". The entire contents of the above-identified applications are hereby incorporated into the present application by reference.

TECHNICAL FIELD

The present disclosure relates to, but is not limited to, the field of display technologies, and in particular to a display substrate and preparation method thereof, and a display apparatus.

BACKGROUND

An Organic Light Emitting Diode (OLED) is an active light emitting display device, which has advantages of auto-luminescence, a wide viewing angle, a high contrast ratio, low power consumption, an extremely high response speed, lightness and thinness, bendability, a low cost, etc. With constant development of display technologies, a flexible display apparatus (Flexible Display) using an OLED as a light emitting device and performing signal control by use of a Thin Film Transistor (TFT for short) has become a mainstream product in the field of display at present, and has been widely used in mobile phones, computers, televisions, vehicles, smart wearable devices and other fields.

At present, the flexible display apparatus is gradually developing from a two-dimensional variable mode to a three-dimensional variable mode. For example, a series of stretch holes are arranged on a display substrate to increase a deformable amount of the display substrate, and four sides of the display substrate are stretched for normal display, thus forming a full-screen mobile phone.

SUMMARY

The following is a summary of subject matters described herein in detail. The summary is not intended to limit the protection scope of claims.

An exemplary embodiment of the present disclosure provides a display substrate including a pixel area and a hole area, the pixel area includes a display structure layer arranged on a base substrate, and the hole area includes a hole structure layer arranged on the base substrate; the hole area includes at least one stretch hole penetrating through the base substrate and the hole structure layer; an inner wall of the stretch hole includes an inorganic material inner wall section and an organic material inner wall section, the inorganic material inner wall section and the organic material inner wall section are arranged along a direction from the base substrate to the hole structure layer, and the organic material inner wall section is located on a side of the stretch hole away from the hole structure layer.

In an exemplary embodiment, the hole structure layer includes a composite insulation layer, an organic emitting block, and an inorganic encapsulation layer; the composite insulation layer is arranged on the base substrate, and a through hole is provided on the base substrate and the composite insulation layer; the organic emitting block is arranged in the through hole, and the inorganic encapsulation layer covers an inner wall of the through hole and the organic emitting block; an emitting block hole is arranged on the organic emitting block, and an inorganic encapsulation hole is arranged on the inorganic encapsulation layer; the stretch hole includes the emitting block hole, the inorganic encapsulation hole, and the through hole whose inner wall is covered by the inorganic encapsulation layer, which are mutually communicated, wherein an inner wall of the inorganic encapsulation hole and the inorganic encapsulation layer covering the inner wall of the through hole form the inorganic material inner wall section, and an inner wall of the emitting block hole forms the organic material inner wall section.

In an exemplary embodiment, the hole structure layer includes a composite insulation layer, an organic material block, and an inorganic encapsulation layer; the composite insulation layer is arranged on the base substrate, and a through hole is provided on the base substrate and the composite insulation layer; the organic material block is arranged in the through hole, and the inorganic encapsulation layer covers an inner wall of the through hole and the organic material block; a material block hole is provided on the organic material block, and an inorganic encapsulation hole is provided on the inorganic encapsulation layer; the stretch hole includes the material block hole, the inorganic encapsulation hole, and the through hole whose inner wall is covered by the inorganic encapsulation layer, which are mutually communicated, wherein an inner wall of the inorganic encapsulation hole and the inorganic encapsulation layer covering the inner wall of the through hole form the inorganic material inner wall section, and an inner wall of the material block hole forms the organic material inner wall section.

In an exemplary embodiment, the hole structure layer includes a composite insulation layer, an organic material block, an organic emitting block, and an inorganic encapsulation layer; the composite insulation layer is arranged on the base substrate, and a through hole is provided on the base substrate and the composite insulation layer; the organic material block is arranged in the through hole, the organic emitting block is arranged on the organic material block, and the inorganic encapsulation layer covers an inner wall of the through hole and the organic emitting block; a material block hole is provided on the organic material block, an emitting block hole is provided on the organic emitting block, and an inorganic encapsulation hole is provided on the inorganic encapsulation layer; the stretch hole includes the material block hole, the emitting block hole, the inorganic encapsulation hole, and the through hole whose inner wall is covered by the inorganic encapsulation layer, which are mutually communicated, wherein an inner wall of the inorganic encapsulation hole and the inorganic encapsulation layer covering the inner wall of the through hole form the inorganic material inner wall section, and an inner wall of the material block hole and an inner wall of the emitting block hole form the organic material inner wall section.

In an exemplary embodiment, the base substrate includes a first flexible layer, a first inorganic layer disposed on the first flexible layer, a second flexible layer disposed on a side of the first inorganic layer away from the first flexible layer, and a second inorganic layer disposed on a side of the second flexible layer away from the first flexible layer; the hole structure layer includes a composite insulation layer and an inorganic encapsulation layer; the composite insulation layer is arranged on the base substrate, and a blind hole is provided on the composite insulation layer and the first inorganic layer, the second flexible layer, and the second inorganic layer in the base substrate; the inorganic encapsulation layer covers an inner wall of the blind hole and the first flexible layer; the first flexible layer in the base substrate is provided with a first flexible hole, and an inorganic encapsulation hole is provided on the inorganic encapsulation layer; the stretch hole includes the first flexible hole, the inorganic encapsulation hole, and the blind hole whose inner wall is covered by the inorganic encapsulation layer, which are mutually communicated, an inner wall of the inorganic encapsulation hole and the inorganic encapsulation layer covering an inner wall of a through hole form the inorganic material inner wall section, and an inner wall of the first flexible hole forms the organic material inner wall section.

In an exemplary embodiment, the base substrate includes a first flexible layer, a first inorganic layer disposed on the first flexible layer, a second flexible layer disposed on a side of the first inorganic layer away from the first flexible layer, and a second inorganic layer disposed on a side of the second flexible layer away from the first flexible layer; the hole structure layer includes a composite insulation layer, an organic emitting block, and an inorganic encapsulation layer; the composite insulation layer is arranged on the base substrate, and a blind hole is provided on the composite insulation layer and the first inorganic layer, the second flexible layer, and the second inorganic layer in the base substrate; the organic emitting block is arranged on the first flexible layer in the blind hole, and the inorganic encapsulation layer covers an inner wall of the blind hole and the organic emitting block; the first flexible layer in the base substrate is provided with a first flexible hole, an emitting block hole is provided on the organic emitting block, and an inorganic encapsulation hole is provided on the inorganic encapsulation layer; the stretch hole includes the first flexible hole, the emitting block hole, the inorganic encapsulation hole, and the blind hole whose inner wall is covered by the inorganic encapsulation layer, which are mutually communicated, an inner wall of the inorganic encapsulation hole and the inorganic encapsulation layer covering an inner wall of a through hole form the inorganic material inner wall section, and an inner wall of the first flexible hole and an inner wall of the emitting block hole form the organic material inner wall section.

In an exemplary embodiment, the base substrate includes a first flexible layer, a first inorganic layer disposed on the first flexible layer, a second flexible layer disposed on a side of the first inorganic layer away from the first flexible layer, and a second inorganic layer disposed on a side of the second flexible layer away from the first flexible layer; the hole structure layer includes a composite insulation layer, an organic material block, and an inorganic encapsulation layer; the composite insulation layer is arranged on the base substrate, and a blind hole is provided on the composite insulation layer and the first inorganic layer, the second flexible layer, and the second inorganic layer in the base substrate; the organic material block is arranged on the first flexible layer in the blind hole, and the inorganic encapsulation layer covers an inner wall of the blind hole and the organic material block; the first flexible layer in the base substrate is provided with a first flexible hole, a material block hole is provided on the organic material block, and an inorganic encapsulation hole is provided on the inorganic encapsulation layer; the stretch hole includes the first flexible hole, the material block hole, the inorganic encapsulation hole, and the blind hole whose inner wall is covered by the inorganic encapsulation layer, which are mutually communicated, an inner wall of the inorganic encapsulation hole and the inorganic encapsulation layer covering an inner wall of a through hole form the inorganic material inner wall section, and an inner wall of the first flexible hole and an inner wall of the material block hole form the organic material inner wall section.

In an exemplary embodiment, the base substrate includes a first flexible layer, a first inorganic layer disposed on the first flexible layer, a second flexible layer disposed on a side of the first inorganic layer away from the first flexible layer, and a second inorganic layer disposed on a side of the second flexible layer away from the first flexible layer; the hole structure layer includes a composite insulation layer, an organic material block, an organic emitting block, and an inorganic encapsulation layer; the composite insulation layer is arranged on the base substrate, and a blind hole is provided on the composite insulation layer and the first inorganic layer, the second flexible layer, and the second inorganic layer in the base substrate; the organic material block is arranged on the first flexible layer in the blind hole, the organic emitting block is arranged on the organic material block in the blind hole, and the inorganic encapsulation layer covers an inner wall of the blind hole and the organic emitting block; the first flexible layer in the base substrate is provided with a first flexible hole, a material block hole is provided on the organic material block, an emitting block hole is provided on the organic emitting block, and an inorganic encapsulation hole is provided on the inorganic encapsulation layer; the stretch hole includes the first flexible hole, the material block hole, the emitting block hole, the inorganic encapsulation hole, and the blind hole whose inner wall is covered by the inorganic encapsulation layer, which are mutually communicated, an inner wall of the inorganic encapsulation hole and the inorganic encapsulation layer covering an inner wall of a through hole form the inorganic material inner wall section, and an inner wall of the first flexible hole, an inner wall of the material block hole, and an inner wall of the emitting block hole form the organic material inner wall section.

In an exemplary embodiment, the display structure layer includes a light emitting structure layer disposed on the base substrate and an encapsulation layer disposed on a side of the light emitting structure layer away from the base substrate; the light emitting structure layer includes an organic emitting layer, and the encapsulation layer includes a first encapsulation layer, an organic encapsulation layer, and a second encapsulation layer which are stacked; the inorganic encapsulation layer includes a first inorganic encapsulation layer and a second inorganic encapsulation layer which are stacked; the organic emitting block and the organic emitting layer are arranged in a same layer and have a same material; the first inorganic encapsulation layer and the first encapsulation layer are arranged in a same layer and have a same material; and the second inorganic encapsulation layer and the second encapsulation layer are arranged in a same layer and have a same material.

In an exemplary embodiment, the display substrate includes a display region and a non-display region, and the stretch hole includes a stretch hole in the display region and a stretch hole in the non-display region.

In an exemplary embodiment, the non-display region includes a circuit region located at a periphery of the display region, an encapsulation region located at a periphery of the circuit region, and a bezel region located at a periphery of the encapsulation region; the stretch hole includes any one or more of following: a stretch hole located in the circuit region, a stretch hole located in the encapsulation region, and a stretch hole located in the bezel region.

In an exemplary embodiment, a width of the stretch hole in the non-display region is greater than a width of the stretch hole in the display region.

In an exemplary embodiment, the width of the stretch hole in the display region is 5 μm to 15 μm, and the width of the stretch hole in the non-display region is 20 μm to 40 μm.

An exemplary embodiment of the present disclosure further provides a display apparatus, including the foregoing display substrate.

An exemplary embodiment of the present disclosure further provides a preparation method of a display substrate, wherein the display substrate includes a pixel area and a hole area, and the preparation method includes: forming a display structure layer disposed on a base substrate in the pixel area and forming a hole structure layer disposed on the base substrate in the hole area; forming at least one stretch hole penetrating through the base substrate and the hole structure layer in the hole area, wherein an inner wall of the stretch hole includes an inorganic material inner wall section and an organic material inner wall section, the inorganic material inner wall section and the organic material inner wall section are arranged along a direction from the base substrate to the hole structure layer, and the organic material inner wall section is located on a side of the stretch hole away from the hole structure layer.

In an exemplary embodiment, the forming the hole structure layer disposed on the base substrate in the hole area, includes: forming a base substrate, wherein the base substrate includes a d first flexible layer, a first inorganic layer, a second flexible layer, and a second inorganic layer that are stacked, and a first inorganic opening is provided on the first inorganic layer; forming a composite insulation layer on the base substrate, wherein a through hole or a blind hole is provided on the base substrate and the composite insulation layer; the through hole penetrates through the composite insulation layer and the base substrate, and the blind hole penetrates through the composite insulation layer and the first inorganic layer, the second flexible layer, and the second inorganic layer in the base substrate; forming an organic emitting block at a bottom of the through hole or the blind hole, or forming an organic material block, or sequentially forming an organic material block and an organic emitting block; and forming an inorganic encapsulation layer in the through hole or the blind hole, wherein the inorganic encapsulation layer covers an inner wall of the through hole or the blind hole and covers the organic emitting block or the organic material block.

In an exemplary embodiment, the display structure layer includes a light emitting structure layer disposed on the base substrate and an encapsulation layer disposed on the light emitting structure layer; the light emitting structure layer includes an organic emitting layer, and the encapsulation layer includes a first encapsulation layer, an organic encapsulation layer, and a second encapsulation layer which are stacked; the inorganic encapsulation layer includes a first inorganic encapsulation layer and a second inorganic encapsulation layer which are stacked; the organic emitting block and the organic emitting layer are arranged in a same layer and are formed through a same process; the first inorganic encapsulation layer and the first encapsulation layer are arranged in a same layer and are formed through a same process; the second inorganic encapsulation layer and the second encapsulation layer are arranged in a same layer and are formed through a same process.

In an exemplary embodiment, the forming at least one stretch hole penetrating through the base substrate and the hole structure layer in the hole area, includes: etching the inorganic encapsulation layer and the organic emitting block in the through hole through a patterning process to form an emitting block hole and an inorganic encapsulation hole communicated with each other, wherein the emitting block hole is arranged on the organic emitting block and the inorganic encapsulation hole is arranged on the inorganic encapsulation layer; wherein an inner wall of the inorganic encapsulation hole and the inorganic encapsulation layer covering the inner wall of the through hole form the inorganic material inner wall section, and an inner wall of the emitting block hole forms the organic material inner wall section; or, etching the inorganic encapsulation layer and the organic material block in the through hole through a patterning process to form a material block hole and an inorganic encapsulation hole communicated with each other, wherein the material block hole is arranged on the organic emitting block and the inorganic encapsulation hole is arranged on the inorganic encapsulation layer; wherein an inner wall of the inorganic encapsulation hole and the inorganic encapsulation layer covering the inner wall of the through hole form the inorganic material inner wall section, and an inner wall of the material block hole forms the organic material inner wall section; or, etching the inorganic encapsulation layer, the organic emitting block, and the organic material block in the through hole through a patterning process to form a material block hole, an emitting block hole, and an inorganic encapsulation hole which are mutually communicated, wherein the material block hole is arranged on the organic emitting block, the emitting block hole is arranged on the organic emitting block, and the inorganic encapsulation hole is arranged on the inorganic encapsulation layer; an inner wall of the inorganic encapsulation hole and the inorganic encapsulation layer covering the inner wall of the through hole form the inorganic material inner wall section, and an inner wall of the material block hole and an inner wall of the emitting block hole form the organic material inner wall section; or, etching the inorganic encapsulation layer, the organic emitting block, and the first flexible layer in the blind hole through a patterning process to form a first flexible hole, an emitting block hole, and an inorganic encapsulation hole which are mutually communicated, wherein the first flexible hole is arranged on the first flexible layer, the emitting block hole is arranged on the organic emitting block, and the inorganic encapsulation hole is arranged on the inorganic encapsulation layer; wherein an inner wall of the inorganic encapsulation hole and the inorganic encapsulation layer covering the inner wall of the blind hole form the inorganic material inner wall section, and an inner wall of the first flexible hole and an inner wall of the emitting block hole form the organic material inner wall section; or, etching the inorganic encapsulation layer, the organic material block, and the first flexible layer in the blind hole through a patterning process to form a first flexible hole, a material block hole, and an inorganic encapsulation hole communicated with each other, wherein the first flexible hole is arranged on the first flexible layer, the material block hole is arranged on the organic material block, and the inorganic encapsulation hole is arranged on the inorganic encapsulation layer; an inner wall of the inorganic encapsulation hole and the inorganic encapsulation layer covering the inner wall of the blind hole form the inorganic material inner wall section, and an inner wall of the first flexible hole and an inner wall of the material block hole form the organic material inner wall section; or, etching the inorganic encapsulation layer, the organic emitting block, the organic material block, and the first flexible layer in the blind hole through a patterning process to form a first flexible hole, a material block hole, an emitting block hole, and an inorganic encapsulation hole communicated with each other, wherein the first flexible hole is arranged on the first flexible layer, the material block hole is arranged on the organic material block, the emitting block hole is arranged on the organic emitting block, and the inorganic encapsulation hole is arranged on the inorganic encapsulation layer; an inner wall of the inorganic encapsulation hole and the inorganic encapsulation layer covering the inner wall of the blind hole form the inorganic material inner wall section, and an inner wall of the first flexible hole, an inner wall of the material block hole, and an inner wall of the emitting block hole form the organic material inner wall section.

Other aspects may be understood upon reading and understanding drawings and detailed description.

BRIEF DESCRIPTION OF DRAWINGS

The drawings are used for providing a further understanding of technical solutions of the present disclosure and constitute a part of the description, and are used for explaining the technical solutions of the present disclosure together with embodiments of the present disclosure, and do not constitute a limitation on the technical solutions of the present disclosure. Shapes and sizes of various components in the drawings do not reflect actual scales, and are only intended to schematically illustrate contents of the present disclosure.

Figure 1:
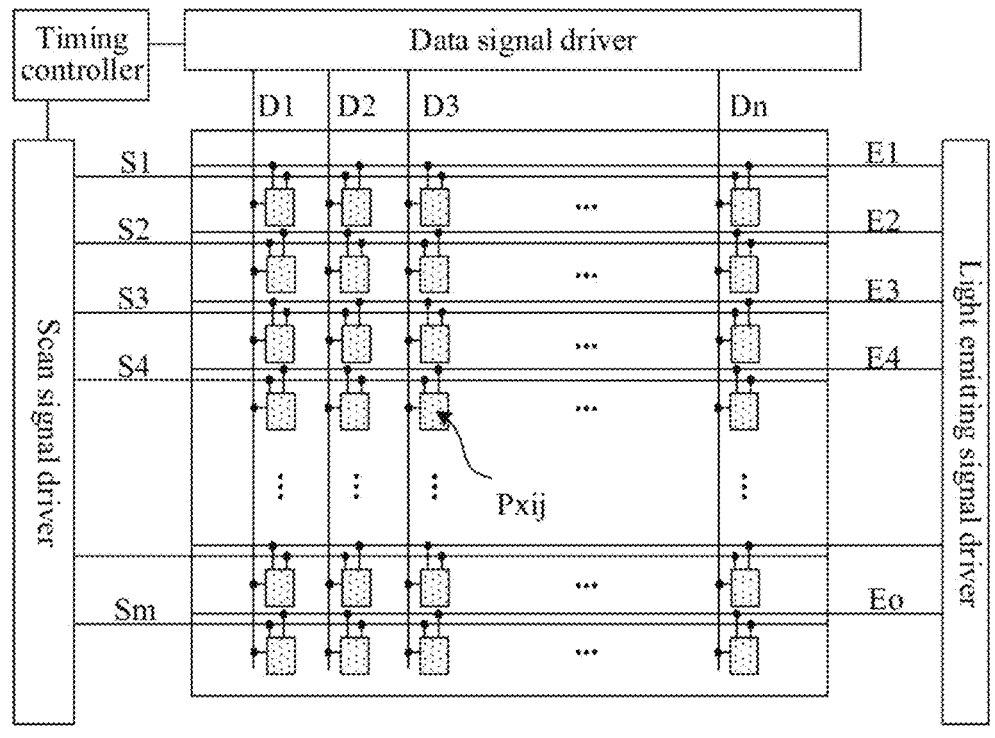
FIG. 1 is a schematic diagram of a structure of a display apparatus.

Reference signs are explained below.

| | | |
|---|---|---|
| 1-glass carrier plate; | 10-base substrate; | 10A-first flexible layer; |
| 10B-first inorganic layer; | 10D-second flexible layer; | 10D-second inorganic layer; |
| 11-first insulation layer; | 12-second insulation layer; | 13-third insulation layer; |
| 14-planarization layer; | 21-anode; | 22-pixel definition layer; |
| 23-organic emitting layer; | 24-cathode; | 31-first encapsulation layer; |
| 32-organic encapsulation layer; | 33-second encapsulation layer; | 40-composite insulation layer; |
| 41-first inorganic encapsulation layer; | 42-second inorganic encapsulation layer; | 51-active layer; |
| 52-gate electrode; | 53-source electrode; | 54-drain electrode; |
| 61-first capacitor electrode; | 62-second capacitor electrode | 100-display region; |
| 101A-transistor; | 101B-storage capacitor; | 102-drive circuit layer; |
| 103-light emitting structure layer; | 104-encapsulation layer; | 200-non-display region |
| 210-circuit region; | 220-encapsulation region; | 230-first bezel region; |
| 300-stretch hole; | 301-organic emitting block; | 302-cathode block; |
| 303-organic material block; | 400-through hole; | 500-blind hole. |

DETAILED DESCRIPTION

To make objectives, technical solutions, and advantages of the present disclosure clearer, the embodiments of the present disclosure will be described in detail with reference to the drawings. It is to be noted that implementation modes may be implemented in multiple different forms. Those of ordinary skill in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of each constituent element, a thickness of a layer, or a region is exaggerated sometimes for clarity. Therefore, one mode of the present disclosure is not necessarily limited to the size, and shapes and sizes of various components in the drawings do not reflect actual scales. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct connection, or an indirect connection through middleware, or internal communication between two elements. Those of ordinary skill in the art may understand specific meanings of these terms in the present disclosure according to specific situations.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In cases that transistors with opposite polarities are used, a direction of a current is changed during operation of a circuit, or the like, and functions of the "source electrode" and the "drain electrode" are sometimes interchangeable. Therefore, the "source electrode" and the "drain electrode" are interchanged in the specification.

In the specification, an "electrical connection" includes a case that constituent elements are connected together through an element with some electrical effect. The "element with some electrical effect" is not particularly limited as long as electrical signals may be sent and received between the connected constituent elements. Examples of the "element with some electrical effect" not only include an electrode and a wiring, but also include a switching element such as a transistor, a resistor, an inductor, a capacitor, another element with various functions, etc.

In the specification, "parallel" refers to a state in which an angle formed by two straight lines is above $-10°$ and below $10°$, and thus also includes a state in which the angle is above $-5°$ and below $5°$. In addition, "perpendicular" refers to a state in which an angle formed by two straight lines is above $80°$ and below $100°$, and thus also includes a state in which the angle is above $85°$ and below $95°$.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

FIG. 1 is a schematic diagram of a structure of a display apparatus. As shown in FIG. 1, an OLED display apparatus may include a timing controller, a data driver, a scan driver, a light emitting driver, and a pixel array. The pixel array may include multiple scan signal lines (S1 to Sm), multiple data signal lines (D1 to Dn), multiple emitting signal lines (E1 to Eo), and multiple sub-pixels Pxij. In an exemplary implementation mode, the timing controller may provide a gray value and a control signal, which are suitable for a specification of the data driver, to the data driver, provide a clock signal, a scan start signal, etc., which are suitable for a specification of the scan driver, to the scan driver, and provide a clock signal, an emission stop signal, etc., which are suitable for a specification of the light emitting driver, to the light emitting driver. The data driver may generate a data voltage to be provided to data signal lines D1, D2, D3, . . . , and Dn using the gray scale value and the control signal received from the timing controller. For example, the data driver may sample the gray value by using the clock signal and apply a data voltage corresponding to the gray value to the data signal lines D1 to Dn by taking a pixel row as a unit, wherein n may be a natural number. The scan driver may generate a scan signal to be provided to scan signal lines S1, S2, S3, . . . , and Sm by receiving a clock signal, a scan start signal, and the like from the timing controller. For example, the scan driver may provide sequentially a scan signal with a turn-on level pulse to the scan signal lines S1 to Sm. For example, the scan driver may be constructed in a form of a shift register and may generate a scan signal in a manner of transmitting sequentially a scan start signal provided in a form of a turn-on level pulse to a next-stage circuit under control of the clock signal, wherein m may be a natural number. The light emitting driver may generate an emission signal to be provided to emitting signal lines E1, E2, E3, .

. . , and Eo by receiving the clock signal, the emission stop signal, and the like from the timing controller. For example, the light emitting driver may provide an emission signal with a turn-off level pulse to the emitting signal lines E1 to Eo sequentially. For example, the light emitting driver may be constructed in a form of a shift register and may generate an emission signal in a manner of transmitting sequentially an emission signal provided in a form of a turn-off level pulse to a next-stage circuit under control of the clock signal, wherein o may be a natural number. The pixel array may include multiple sub-pixels Pxij. Each sub-pixel Pxij may be connected to a corresponding data signal line, a corresponding scan signal line, and a corresponding emitting signal line. Herein, i and j may be natural numbers. The sub-pixel Pxij may refer to a sub-pixel in which a transistor is connected to an i-th scan signal line and is connected to a j-th data signal line.

Figure 2:
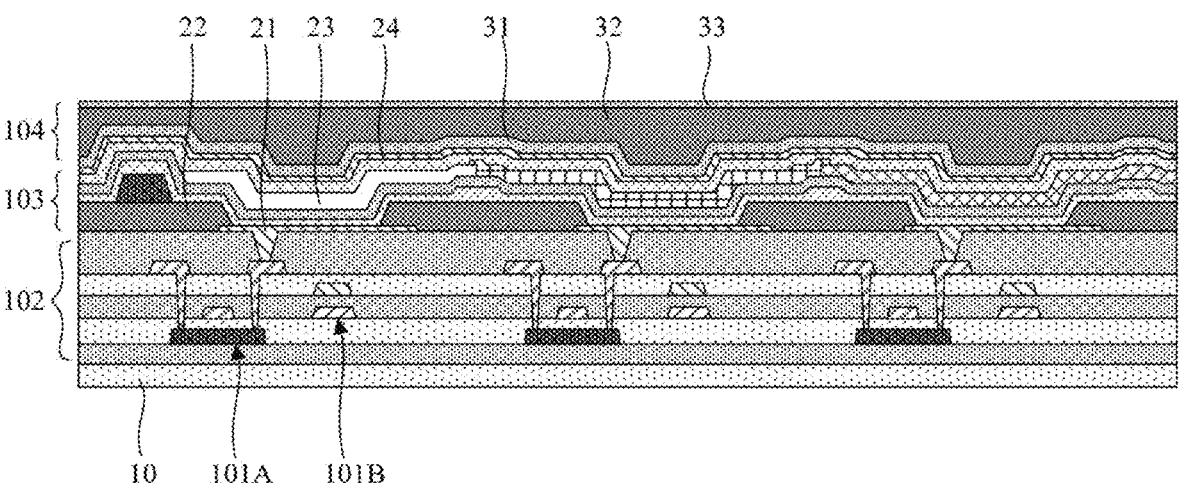
FIG. 2 is a schematic diagram of a cross-sectional structure of a display substrate.

FIG. 2 is a schematic diagram of a cross-sectional structure of a display substrate, which illustrates a structure of three sub-pixels of an OLED display substrate. As shown in FIG. 2, on a plane perpendicular to the display substrate, the display substrate may include a drive circuit layer 102 disposed on a base substrate 10, a light emitting device 103 disposed on a side of the drive circuit layer 102 away from the base substrate 10, and an encapsulation layer 104 disposed on a side of the light emitting device 103 away from the base substrate 10. In some possible implementation modes, the display substrate may include another film layer, such as a Post Spacer, which is not limited in the present disclosure.

In an exemplary implementation mode, the base substrate 10 may be a flexible base substrate, or a rigid base substrate. A drive circuit layer 102 of each sub-pixel may include multiple transistors and a storage capacitor constituting a pixel drive circuit, in FIG. 3, a case where each sub-pixel includes a drive transistor 101A and a storage capacitor 101B is taken as an example for illustration. The light emitting device 103 may include an anode 21, a pixel definition layer 22, an organic emitting layer 23, and a cathode 24. The anode 21 is connected with a drain electrode of the drive transistor 101A through a via, the organic emitting layer 23 is connected with the anode 21, and the cathode 24 is connected with the organic emitting layer 23, The organic emitting layer 23 emits light of a corresponding color under drive of the anode 21 and the cathode 24. The encapsulation layer 104 may include a first encapsulation layer 31, an organic encapsulation layer 32, and a second encapsulation layer 33 that are stacked; the first encapsulation layer 31 and the second encapsulation layer 33 may be made of an inorganic material, and the organic encapsulation layer 32 may be made of an organic material; the organic encapsulation layer 32 is disposed between the first encapsulation layer 31 and the second encapsulation layer 33 to ensure that external water vapor cannot enter into the light emitting device 103.

In an exemplary implementation mode, the organic emitting layer 23 may include a hole injection layer, a hole transport layer, an electron block layer, an emitting layer, a hole block layer, an electron transport layer, and an electron injection layer that are stacked. In an exemplary implementation mode, hole injection layers and electron injection layers of all sub-pixels may be connected together as a common layer, hole transport layers and electron transport layers of all the sub-pixels may be connected together as a common layer, hole block layers of all the sub-pixels may be connected together as a common layer, and emitting layers and electron block layers of adjacent sub-pixels may be slightly overlapped with each other, or may be isolated from each other.

Figure 3:
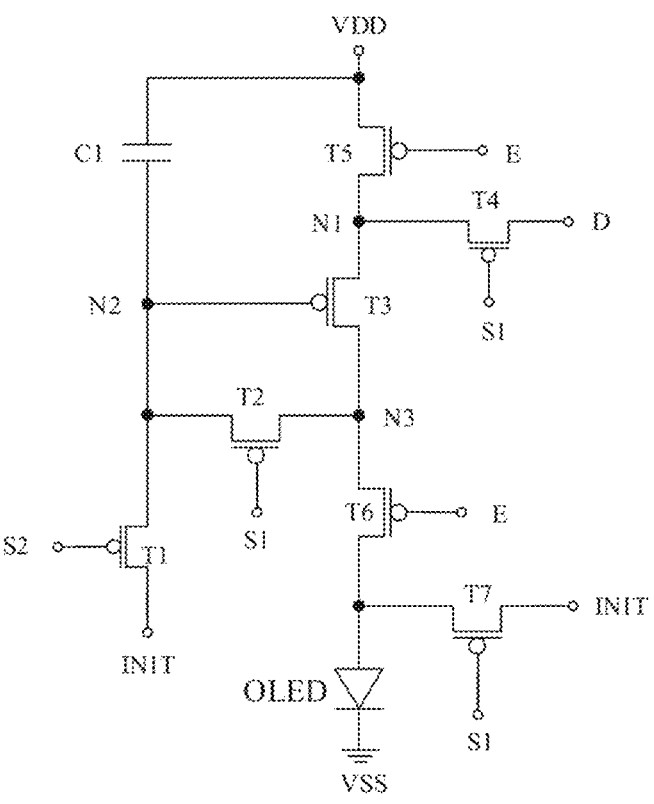
FIG. 3 is a schematic diagram of an equivalent circuit of a pixel drive circuit.

In an exemplary implementation mode, the pixel drive circuit may be in a 3T1C, 4T1C, 5T1C, 5T2C, 6T1C, or 7T1C structure. FIG. 3 is a schematic diagram of an equivalent circuit of a pixel drive circuit. As shown in FIG. 3, the pixel drive circuit may include seven switching transistors (a first transistor T1 to a seventh transistor T7), one storage capacitor C, and seven signal lines (a data signal line D, a first scan signal line S1, a second scan signal line S2, an emitting signal line E, an initial signal line INIT, a first power supply line VDD, and a second power supply line VSS).

In an exemplary implementation mode, a first terminal of the storage capacitor C is connected with the first power supply line VDD, and a second terminal of the storage capacitor C is connected with a second node N2, namely the second terminal of the storage capacitor C is connected with a control electrode of the third transistor T3.

A control electrode of the first transistor T1 is connected with the second scan signal line S2, a first electrode of the first transistor T1 is connected with the initial signal line INIT, and a second electrode of the first transistor is connected with the second node N2. When a scan signal with a turn-on level is applied to the second scan signal line S2, the first transistor T1 transmits an initialization voltage to a control electrode of the third transistor T3 so as to initialize a charge amount of the control electrode of the third transistor T3.

A control electrode of the second transistor T2 is connected with the first scan signal line S1, a first electrode of the second transistor T2 is connected with the second node N2, and a second electrode of the second transistor T2 is connected with a third node N3. When a scan signal with a turn-on level is applied to the first scan signal line S1, the second transistor T2 enables the control electrode of the third transistor T3 to be connected with a second electrode of the third transistor T3.

The control electrode of the third transistor T3 is connected with the second node N2, namely the control electrode of the third transistor T3 is connected with the second terminal of the storage capacitor C, a first electrode of the third transistor T3 is connected with a first node N1, and a second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4 may be referred to as a switching transistor, a scan transistor, etc., and when a scan signal with a turn-on level is applied to the first scan signal line S1, the fourth transistor T4 enables a data voltage of the data signal line D to be input to the pixel drive circuit.

A control electrode of the fifth transistor T5 is connected with the emitting signal line E, a first electrode of the fifth transistor T5 is connected with the first power supply line VDD, and a second electrode of the fifth transistor T5 is connected with the first node N1. A control electrode of the sixth transistor T6 is connected with the emitting signal line E, a first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When an emitting signal with a turn-on level is applied to the emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected with the first scan signal line S1, a first electrode of the seventh transistor T7 is connected with the initial signal line INIT, and a second electrode of the seventh transistor T7 is connected with the first electrode of the light emitting device. When a scan signal with a turn-on level is applied to the first scan signal line S1, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary implementation mode, a second electrode of the light emitting device is connected with the second power supply line VSS, a signal of the second power supply line VSS is a low-level signal, and a signal of the first power supply line VDD is a high-level signal continuously provided. The first scan signal line S1 is a scan signal line in a pixel drive circuit of a current display row, and the second scan signal line S2 is a scan signal line in a pixel drive circuit of a previous display row. That is, for an n-th display row, the first scan signal line S1 is S(n), and the second scan signal line S2 is S(n−1). The second scan signal line S2 of the current display row and the first scan signal line S1 in the pixel drive circuit of the previous display row are a same signal line, thus signal lines of a display panel may be reduced, so that a narrow bezel of the display panel is achieved.

In an exemplary implementation mode, the first transistor T1 to the seventh transistor T7 may be P-type transistors or may be N-type transistors. Use of a same type of transistors in a pixel drive circuit may simplify a process flow, reduce process difficulties of a display panel, and improve a product yield. In some possible implementation modes, the first transistor T1 to the seventh transistor T7 may include a P-type transistor and an N-type transistor.

In an exemplary implementation mode, the first scan signal line S1, the second scan signal line S2, the emitting signal line E, and the initial signal line INIT extend along a horizontal direction, and the second power supply line VSS, the first power supply line VDD, and the data signal line D extend along a vertical direction.

In an exemplary implementation mode, the light emitting device may be an organic light emitting diode (OLED), including a first electrode (anode), an organic emitting layer, and a second electrode (cathode) that are stacked.

Figure 4:
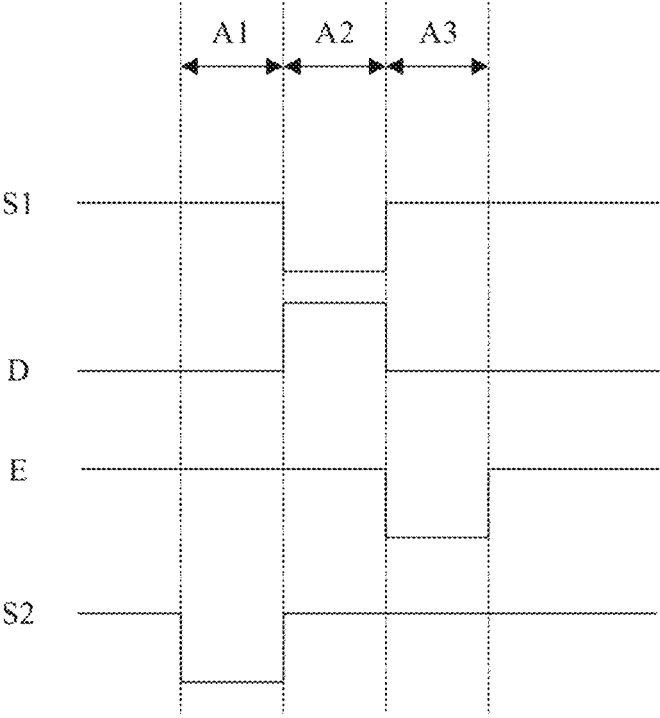
FIG. 4 is a working timing diagram of a pixel drive circuit.

FIG. 4 is a working timing diagram of a pixel drive circuit. An exemplary embodiment of the present disclosure will be described below through a working process of the pixel drive circuit shown in FIG. 3. The pixel drive circuit in FIG. 3 includes seven transistors (a first transistor T1 to a seventh transistor T7), one storage capacitor C, and seven signal lines (a data signal line D, a first scan signal line S1, a second scan signal line S2, an emitting signal line E, an initial signal line INIT, a first power supply line VDD, and a second power supply line VSS), wherein all of the seven transistors are P-type transistors.

In an exemplary implementation mode, the working process of the pixel drive circuit may include following stages.

In a first stage A1, referred to as a reset stage, a signal of the second scan signal line S2 is a low-level signal, and signals of the first scan signal line S1 and the emitting signal line E are high-level signals. The signal of the second scan signal line S2 is the low-level signal, so that the first transistor T1 is turned on, and a signal of the initial signal line INIT is provided to a second node N2 to initialize the storage capacitor C to clear an original data voltage in the storage capacitor. The signals of the first scan signal line S1 and the emitting signal line E are high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, a signal of the first scan signal line S1 is a low-level signal, signals of the second scan signal line S2 and the emitting signal line E are high-level signals, and the data signal line D outputs a data voltage. In this stage, a second terminal of the storage capacitor C is at a low level, so the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on, so that the data voltage outputted by the data signal line D is provided to the second node N2 through a first node N1, the turned-on third transistor T3, a third node N3, and the turned-on second transistor T2, and the storage capacitor C is charged with a difference between the data voltage outputted by the data signal line D and a threshold voltage of the third transistor T3. A voltage at the second terminal (the second node N2) of the storage capacitor C is Vd−|Vth|, wherein Vd is the data voltage outputted by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light. A signal of the second scan signal line S2 is a high-level signal, so that the first transistor T1 is turned off. A signal of the emitting signal line E is a high-level signal, so that the fifth transistor T5 and the sixth transistor T6 are turned off.

In a third stage A3, referred to as a light emitting stage, a signal of the emitting signal line E is a low-level signal, and signals of the first scan signal line S1 and the second scan signal line S2 are high-level signals. The signal of the emitting signal line E is the low-level signal, so that the fifth transistor T5 and the sixth transistor T6 are turned on, and a power voltage outputted by the first power supply line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vd−|Vth|, so that the drive current of the third transistor T3 is as follows.

$$I = K^* (Vgs - Vth)^2 = K^* [(Vdd - Vd + |Vth|) - Vth]^2 = K^* [(Vdd - Vd)]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage outputted by the data signal line D, and Vdd is the power voltage outputted by the first power supply line VDD.

Figure 5:
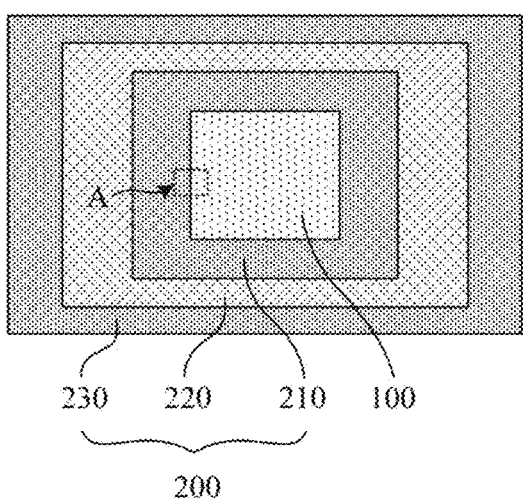
FIG. 5 is a schematic plan view of a display substrate.

FIG. 5 is a schematic plan view of a display substrate. As shown in FIG. 5, in a plane parallel to the display substrate, the display substrate may include a display region 100 and a non-display region located at a periphery of the display region 100. In an exemplary implementation mode, the display region 100 may include multiple pixel units referred to as an Active Area (AA) and the non-display region 200 may include a circuit region 210, an encapsulation region 220, and a bezel region 230. In an exemplary implementation mode, the circuit region 210 may be located at the periphery of the display region 100 and may include a corresponding drive circuit, a signal line, and the like, and is configured to transmit a drive signal to multiple pixel units in the display region 100. The encapsulation region 220 may be located at a periphery of the circuit region 210 and may include corresponding dam spacers, and is configured to block water vapor from the bezel region 230 into the display region 100, the dam spacers extend along a direction parallel to an edge of the display region to form an annular structure around the display region 100. The bezel region 230 may be located at a periphery of the encapsulation region 220 and may include structures such as a crack dam and a cutting groove.

Figure 6:
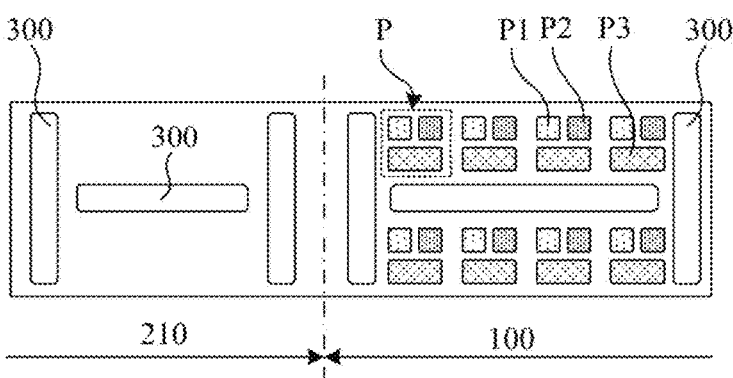
FIG. 6 is a schematic plan view showing a stretch hole in a display substrate.

FIG. 6 is a schematic plan view showing a stretch hole in a display substrate, and is an enlarged view of a Region A in FIG. 5. As shown in FIG. 6, the display region 100 may include multiple pixel units P arranged in a matrix manner. At least one of the multiple pixel units P may include a first light emitting unit (sub-pixel) P1 that emits light of a first color, a second light emitting unit P2 that emits light of a second color, and a third light emitting unit P3 that emits light of a third color. Each light emitting unit includes a pixel drive circuit and a light emitting device. The pixel drive circuit is respectively connected with a scan signal line, a data signal line, and an emitting signal line. The pixel drive circuit is configured to receive a data voltage transmitted by the data signal line under control of the scan signal line and the emitting signal line, and output a corresponding current to the light emitting device. A light emitting device in each light emitting unit is respectively connected with a pixel drive circuit of the light emitting unit where the light emitting device is located, and the light emitting device is configured to emit light with corresponding brightness in response to a current output by the pixel drive circuit of the light emitting unit where the light emitting device is located. In an exemplary implementation mode, the first light emitting unit P1 may be a red (R) light emitting unit, the second light emitting unit P2 may be a blue (B) light emitting unit, and the third light emitting unit P3 may be a green (G) light emitting unit. In an exemplary implementation mode, at least one of the multiple pixel units P may include four light emitting units such as a red light emitting unit, a green light emitting unit, a blue light emitting unit, and a white light emitting unit. In an exemplary implementation mode, a shape of a light emitting unit in a pixel unit may be a rectangle, a rhombus, a pentagon, or a hexagon. When the pixel unit includes three light emitting units, the three light emitting units may be arranged in a manner to stand side by side horizontally, in a manner to stand side by side vertically, or in a manner like a Chinese character "品". When the pixel unit includes four light emitting units, the four light emitting units may be arranged in a manner to stand side by side horizontally, in a manner to stand side by side vertically, or in a manner to form a Square, which is not limited in the present disclosure.

In an exemplary implementation mode, the display region 100 and the circuit region 210 of the non-display region may include multiple stretch holes 300 configured to increase a deformable amount of the display substrate. On a plane perpendicular to the display substrate, a base substrate and a structural film layer in a stretch hole 300 are completely removed to form a through hole structure, or a base substrate and a structural film layer in a stretch hole 300 are partially removed to form a blind hole structure. On a plane parallel to the display substrate, a shape of a stretch hole may be a strip shape, and the shape of the stretch hole may include any one or more of following: an "I" shape, a "T" shape, an "L" shape, and an "H" shape, and the present disclosure is not limited herein.

In an exemplary implementation mode, multiple stretch holes in the display region may divide the display region into multiple pixel areas spaced from each other, and the multiple pixel areas in the display region may divide the display region into multiple hole areas spaced from each other. Each pixel area may include one or more pixel units, each pixel unit includes three or four light emitting units emitting light of different colors, and each hole area may include one or more stretch holes. In an exemplary implementation mode, an arrangement mode of stretch holes in the non-display region is substantially similar to that of the stretch holes in the display region.

Figure 7:
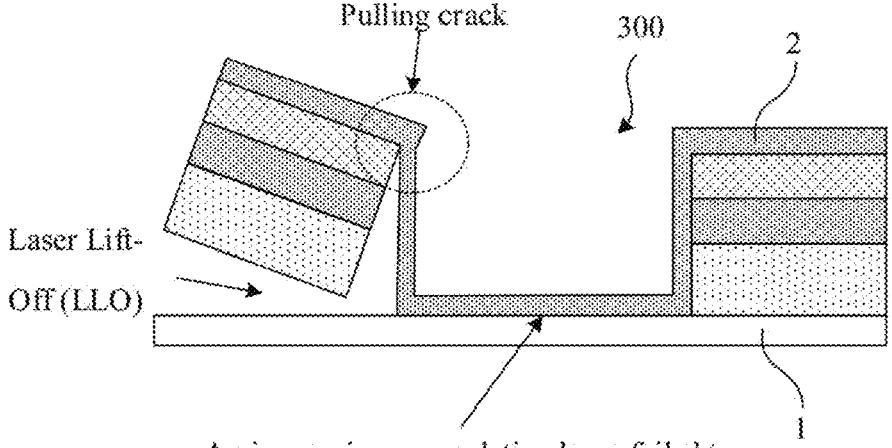
FIG. 7 is schematic diagram of lifting off of a flexible display substrate.

At present, the display substrate provided with stretch holes has a problem of encapsulation failure. It is found through research that the display substrate provided with stretch holes has the problem of encapsulation failure, which is caused by residues of an inorganic encapsulation layer in the stretch holes to a certain extent. A preparation process of a flexible display substrate may include: sequentially preparing a flexible base substrate, a drive circuit layer, a light emitting structure layer, and an encapsulation layer on a glass substrate. Then, etching a hole area in the entire display substrate to remove all structure layers in a stretch hole. Then, the display substrate is lifted off from the glass substrate through a Laser Lift-Off (LLO) process. FIG. 7 is schematic diagram of lifting off of a flexible display substrate. At present, in a current hole area etching process, it is difficult to completely etch away a structure layer in a stretch hole, especially an inorganic encapsulation layer directly deposited on the glass substrate, so that a part of the inorganic encapsulation layer attached to the glass substrate will be remained at a bottom of the stretch hole. As shown in FIG. 7, when a part of an inorganic encapsulation layer is remained at a bottom of a stretch hole, an adhesive force between an inorganic encapsulation layer 2 and a glass substrate 1 is relatively strong, thus there is a case where a part of the inorganic encapsulation layer 2 cannot be separated from the glass substrate 1 in a lift-off process. When the inorganic encapsulation layer cannot be separated from the glass substrate, the inorganic encapsulation layer remained on the glass substrate will cause a crack in the encapsulation layer, and the crack on the encapsulation layer will extend to the display region, which will lead to encapsulation failure of the display substrate.

Figures 8, 9:
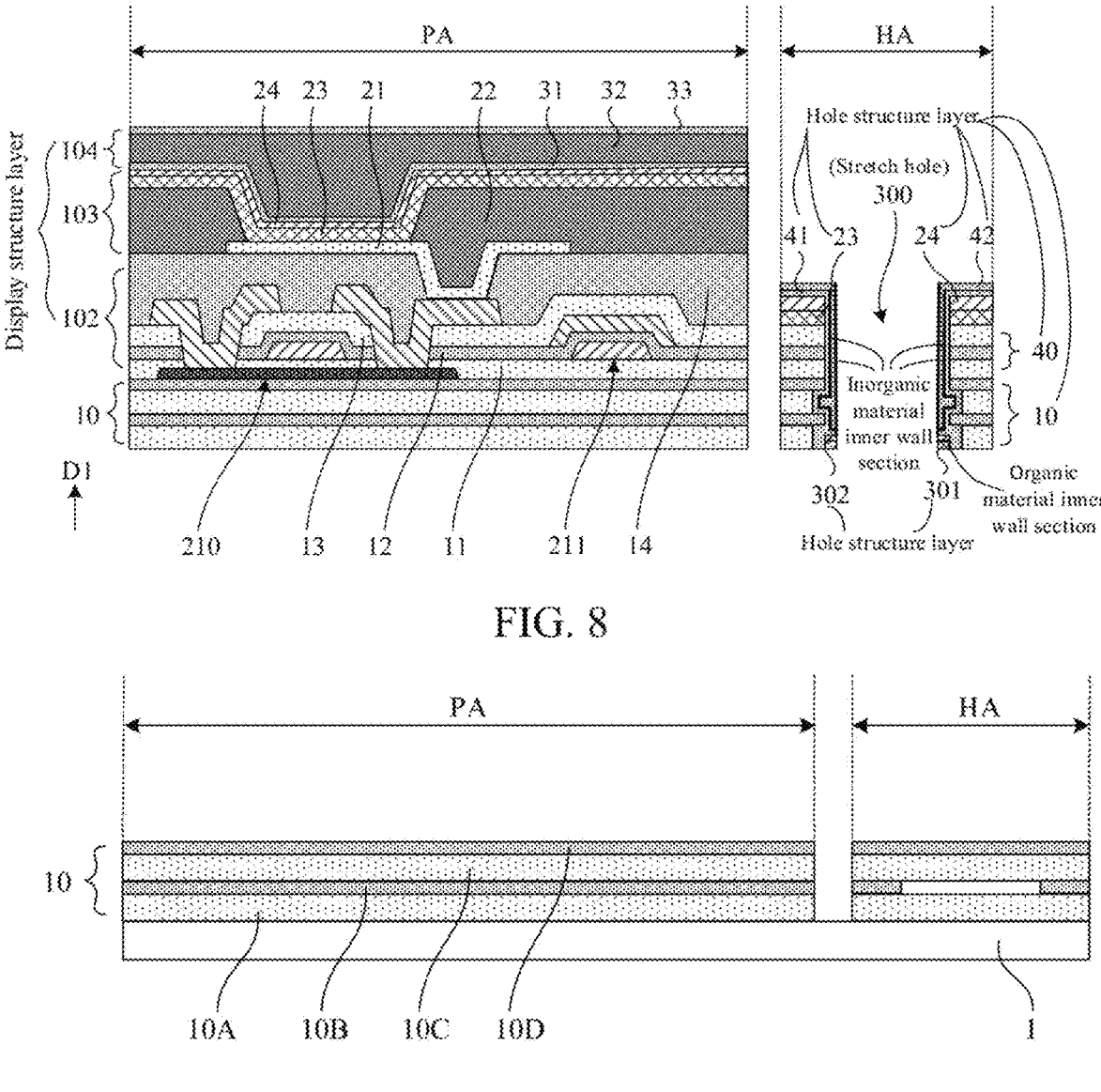
FIG. 8 is a schematic diagram of a structure of a display substrate according to an exemplary embodiment of the present disclosure.
FIG. 9 is a schematic diagram after a pattern of a base substrate is formed according to an exemplary embodiment of the present disclosure.

FIG. 8 is a schematic diagram of a structure of a display substrate according to an exemplary embodiment of the present disclosure, wherein a cross-sectional structure of a pixel area PA and a hole area HA in the display substrate is illustrated. As shown in FIG. 8, in an exemplary implementation mode, the display substrate may include a pixel area PA and a hole area HA, the pixel area PA includes a base substrate and a display structure layer disposed on the base substrate, and the hole area HA includes the base substrate and a hole structure layer disposed on the base substrate. The hole area HA further includes at least one stretch hole 300 penetrating through the base substrate and the hole structure layer. In an exemplary implementation mode, an inner wall is formed by an inner sidewall of the stretch hole 300 penetrating through the base substrate and the hole structure layer. The inner wall is an inner wall with a composite structure, and the inner wall with the composite structure includes an inorganic material inner wall section formed by an inorganic material film layer and an organic material inner wall section formed by an organic material film layer. In a plane perpendicular to the display substrate, the inorganic material inner wall section and the organic material inner wall section are arranged along a first direction D1, that is, the organic material inner wall section is located on a side of the stretch hole 300 away from the hole structure layer, and the first direction D1 is a direction from the base substrate to the display structure layer.

In an exemplary implementation mode, the display structure layer of the pixel area PA may include a drive circuit layer 102 disposed on a side of the base substrate 10 in the first direction D1, a light emitting structure layer 103 disposed on a side of the drive circuit layer 102 in the first direction D1, and an encapsulation layer 104 disposed on a side of the light emitting structure layer 103 in the first direction D1. The drive circuit layer 102 may include a transistor 101A and a storage capacitor 101B constituting a pixel drive circuit. The light emitting structure layer 103 may include an anode 21, a pixel definition layer 22, an organic emitting layer 23, and a cathode 24. The encapsulation layer 104 may include a first encapsulation layer 31, an organic encapsulation layer 32, and a second encapsulation layer 33 that are stacked along the first direction D1.

In an exemplary implementation mode, the hole structure layer of the hole area HA may include a composite insulation layer 40, an organic emitting layer 23, an organic emitting block 301, and an inorganic encapsulation layer. The composite insulation layer 40 is disposed on one side of the base substrate 10 in the first direction D1, and a through hole is provided on the base substrate 10 and the composite insulation layer 40. The organic emitting layer 23 is disposed on a side of the composite insulation layer 40 in the first direction D1 outside the through hole, and the organic emitting block 301 is disposed in the through hole and is located on a side of the hole structure layer away from the composite insulation layer 40 in an opposite direction (i.e., a direction from the composite insulation layer 40 to the base substrate 10) of the first direction D1, and an emitting block hole is provided on the organic emitting block 301. The inorganic encapsulation layer is provided on a side of the organic emitting layer 23 in the first direction D1, on a side of the organic emitting block 301 in the first direction D1, and on an inner wall of the through hole. An inorganic encapsulation hole is provided on the inorganic encapsulation layer.

In an exemplary implementation mode, the emitting block hole provided on the organic emitting block 301, the inorganic encapsulation hole provided on the inorganic encapsulation layer, and the through hole whose inner wall is covered by the inorganic encapsulation layer are communicated with each other and together form a stretch hole 300.

In an exemplary implementation mode, an inner wall of the inorganic encapsulation hole and the inorganic encapsulation layer covering the inner wall of the through hole together form an inorganic material inner wall section, and an inner wall of the emitting block hole forms an organic material inner wall section.

In an exemplary implementation mode, the inorganic encapsulation layer includes a first inorganic encapsulation layer 41 and a second inorganic encapsulation layer 42 that are stacked, and the inorganic encapsulation hole includes a first encapsulation hole provided on the first inorganic encapsulation layer 41 and a second encapsulation hole provided on the second inorganic encapsulation layer 42, and the first encapsulation hole and the second encapsulation hole are communicated with each other. In an exemplary implementation mode, the emitting block hole provided on the organic emitting block 301, the first encapsulation hole provided on the first inorganic encapsulation layer 41, the second encapsulation hole provided on the second inorganic encapsulation layer 42, and a through hole covered by the first inorganic encapsulation layer 41 and the second inorganic encapsulation layer 42 are communicated with each other to form a stretch hole 300 together. An inner wall of the first encapsulation hole, an inner wall of the second encapsulation hole, and the second inorganic encapsulation layer covering the through hole together form an inorganic material inner wall section, and an inner wall of the emitting block hole forms an organic material inner wall section.

In an exemplary implementation mode, the hole structure layer may include a cathode 24 and a cathode block 302, the cathode 24 is disposed on a side of the organic emitting layer 23 in the first direction D1 outside a through hole, the cathode block 302 is disposed on a side of the organic emitting block 301 in the first direction D1 inside the through hole, a cathode block hole is disposed on the cathode block 302, and the cathode block hole is communicated with the inorganic encapsulation hole and the emitting block hole. An inner wall of the cathode block hole forms a conductive material inner wall section, along the first direction D1, the conductive material inner wall section is located between the inorganic material inner wall section and the organic material inner wall section.

In an exemplary implementation mode, the organic emitting block 301 of the hole structure layer and the organic emitting layer 23 of the light emitting structure layer are disposed in a same layer, have a same material, and are formed simultaneously through a same process. The cathode block 302 of the hole structure layer and the cathode 24 of the light emitting structure layer are disposed in a same layer, have a same material, and are simultaneously formed through a same process. The first inorganic encapsulation layer 41 of the hole structure layer and the first encapsulation layer 31 of the encapsulation layer are disposed in a same layer, have a same material, and are formed simultaneously through a same process. The second inorganic encapsulation layer 42 and the second encapsulation layer 33 of the encapsulation layer are disposed in a same layer, have a same material, and are simultaneously formed through a same process.

In an exemplary implementation mode, the drive circuit layer 102 of the pixel area PA may include: an active layer disposed on the base substrate 10, a first insulation layer 11 covering the active layer; a gate electrode and a first capacitor electrode disposed on the first insulation layer 11, a second insulation layer 12 covering the gate electrode and the first capacitor electrode, a second capacitor electrode disposed on the second insulation layer 12, a third insulation layer 13 covering the second capacitor electrode, a source electrode and a drain electrode disposed on the third insulation layer 13, and a planarization layer 14 covering the source electrode and the drain electrode. The active layer, the gate electrode, the source electrode, and the drain electrode form a transistor 101A, and the first capacitor electrode and the second capacitor electrode form a storage capacitor 101B.

In an exemplary implementation mode, the base substrate 10 may include a first flexible layer, a first inorganic layer disposed on a side of the first flexible layer in the first direction D1, a second flexible layer disposed on a side of the first inorganic layer in the first direction D1, and a second inorganic layer disposed on a side of the second flexible layer in the first direction D1. A base substrate hole is provided on the base substrate 10 of the hole area HA. The composite insulation layer 40 of the hole area HA includes a first insulation layer 11, a second insulation layer 12, and a third insulation layer 13 stacked on the base substrate 10, and a composite insulation hole is provided on the composite insulation layer. In an exemplary implementation mode, the aforementioned through hole includes a base substrate hole and a composite insulation hole that are communicated with each other.

In an exemplary implementation mode, the display substrate may include a display region and a non-display region, and the non-display region may include a circuit region, an encapsulation region, and a bezel region. A stretch hole shown in FIG. 8 may be a stretch hole in a display region or may be a stretch hole in a non-display region. The stretch hole may include any one or more of the following: a stretch hole located in the display region, a stretch hole located in the circuit region, a stretch hole located in the encapsulation region, and a stretch hole located in the bezel region.

In an exemplary implementation mode, in a plane parallel to the display substrate, a width of the stretch hole in the non-display region may be greater than a width of the stretch hole in the display region, and a width of a stretch hole refers to a dimension perpendicular to an extension direction of a strip-shaped stretch hole.

In an exemplary implementation mode, a width of the stretch hole in the display region may be 5 μm to 15 μm, and a width of the stretch hole in the non-display region may be 20 μm to 40 μm. For example, a width of the stretch hole in the display region may be 10 μm, and a width of the stretch hole in the non-display region may be 30 μm.

In an exemplary implementation mode, in a plane parallel to the display substrate, a shape of the stretch hole in the display region and a shape of the stretch hole in the non-display region may be the same, or a shape of the stretch hole in the display region may be different from a shape of the stretch hole in the non-display region. For example, a shape of the stretch hole in the display region may be an "I" shape, and a shape of the stretch hole in the non-display region may be an "H" shape, which is not limited in the present disclosure.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition and coating. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed in a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of A contains an orthographic projection of B" refers to that a boundary of the orthographic projection of B falls within a range of a boundary of the orthographic projection of A, or a boundary of the orthographic projection of A is overlapped with a boundary of the orthographic projection of B.

In an exemplary implementation mode, a preparation process of a display substrate may include following operations, the display substrate is illustrated by taking a pixel area PA including one sub-pixel and a hole area HA including one stretch hole as an example, and a pixel drive circuit of a sub-pixel is illustrated by including a transistor and a storage capacitor as an example.

(1) A pattern of a base substrate is formed. In an exemplary embodiment of the present disclosure, the base substrate may be a flexible base substrate including a first flexible layer, a first inorganic layer, a second flexible layer, and a second inorganic layer stacked on a glass carrier 1. In an exemplary implementation mode, forming the pattern of the base substrate may include: first a first flexible thin film is coated on the glass carrier plate 1, the first flexible thin film is cured into a film to form a first flexible layer 10A; subsequently, a first inorganic thin film is deposited, and the first inorganic thin film is patterned through a patterning process to form a first inorganic layer 10B, wherein the first inorganic layer 10B in an HA region is formed with a first inorganic hole; subsequently, a second flexible thin film is coated, and the second flexible thin film is cured into a film to form a second flexible layer 10C; subsequently, a second inorganic thin film is deposited to form a second inorganic layer 10D to complete preparation of the base substrate 10, as shown in FIG. 9.

In an exemplary implementation mode, materials of the first flexible layer and the second flexible layer may be polyimide (PI), polyethylene terephthalate (PET), or surface-treated soft polymer film, etc. Materials of the first inorganic layer and the second inorganic layer may be Silicon Nitride (SiNx) or Silicon Oxide (SiOx), etc. The first inorganic layer and the second inorganic layer may be referred to as barrier layers or buffer layers.

After this process, a PA region and the HA region include the base substrate 10, and the first inorganic layer 10B of the HA region is provided with the first inorganic hole.

(2) A pattern of a drive circuit layer is formed on the base substrate. In an exemplary implementation mode, the drive circuit layer may include a transistor and a storage capacitor constituting a pixel drive circuit. In an exemplary implementation mode, forming the pattern of the drive circuit layer may include following operations.

A semiconductor thin film is deposited on a base substrate 10, the semiconductor thin film is patterned through a patterning process, and a pattern of a semiconductor layer is formed on the base substrate 10, the pattern of the semiconductor layer is formed in the PA region and at least includes an active layer 51. After this process, the semiconductor thin film in the HA region is etched away, exposing the base substrate 10, that is, the HA region includes the base substrate 10.

Subsequently, a first insulation thin film and a first metal thin film are deposited in sequence, and the first metal thin film is patterned through a patterning process to form a first insulation layer 11 covering the pattern of the semiconductor layer and a pattern of a first metal layer disposed on the first insulation layer 11. The pattern of the first metal layer is formed in the PA region, and at least includes a gate electrode 52 and a first capacitor electrode 61. An orthographic projection of the gate electrode 52 on the base substrate is within a range of an orthographic projection of the active layer 51 on the base substrate. After this process, the first metal thin film in the HA region is etched away, leaving the first insulation layer 11, that is, the HA region includes the base substrate 10 and the first insulation layer 11 provided on the base substrate 10.

Subsequently, a second insulation thin film and a second metal thin film are sequentially deposited, and the second metal thin film is patterned through a patterning process to form a second insulation layer 12 covering the pattern of the first metal layer and a pattern of a second metal layer disposed on the second insulation layer 12. The pattern of the second metal layer is formed in the PA region and at least includes a second capacitor electrode 62, and a position of the second capacitor electrode 62 corresponds to a position of the first capacitor electrode 61. After this process, the second metal thin film in the HA region is etched away, leaving the second insulation layer 12, i.e. the HA region includes a base substrate 10, the first insulation layer 11 disposed on the base substrate 10, and the second insulation layer 12 disposed on the first insulation layer 11.

Subsequently, a third insulation thin film is deposited, and the third insulation thin film is patterned through a patterning process to form a third insulation layer 13 covering the pattern of the second metal layer. Active vias are formed in the PA region, and a through hole 400 is formed in the HA region. Positions of two active vias in the PA region are respectively located at both ends of the active layer 51, and the third insulation layer 13, the second insulation layer 12, and the first insulation layer 11 in the active vias are etched away to expose a surface of the active layer 51, respectively. The third insulation layer 13, the second insulation layer 12, the first insulation layer 11, the second inorganic layer 10D, the second flexible layer 10C, and the first flexible layer 10A within the through hole 400 in the HA region are removed to expose a surface of the glass substrate 1. The through hole 400 includes a first inorganic hole. After this process, the HA region includes the base substrate 10 and the composite insulation layer 40 disposed on the base substrate 10, the through hole 400 penetrates through the base substrate 10 and the composite insulation layer, and the composite insulation layer 40 includes the first insulation layer 11, the second insulation layer 12, and the third insulation layer 13 that are stacked.

Subsequently, a third metal thin film is deposited and patterned through a patterning process to form a pattern of a third metal layer on the third insulation layer 13. The pattern of the third metal layer is formed in the PA region, and at least includes a source electrode 53 and a drain electrode 54, and the source electrode 53 and the drain electrode 54 are respectively connected with the active layer 51 through active vias. After this process, the third metal thin film in the HA region is etched away, and a structure of the HA region is the same as that after a previous process.

Subsequently, a planarization thin film is deposited and patterned through a patterning process to form a planarization layer 14 covering the pattern of the third metal layer in the PA region. A pattern of an anode via is provided on the planarization layer 14, and the planarization layer 14 in the anode via is removed to expose a surface of the drain electrode 54. After this process, the planarization thin film in the HA region is removed, and the structure of the HA region is the same as that after a previous process.

Figure 10:
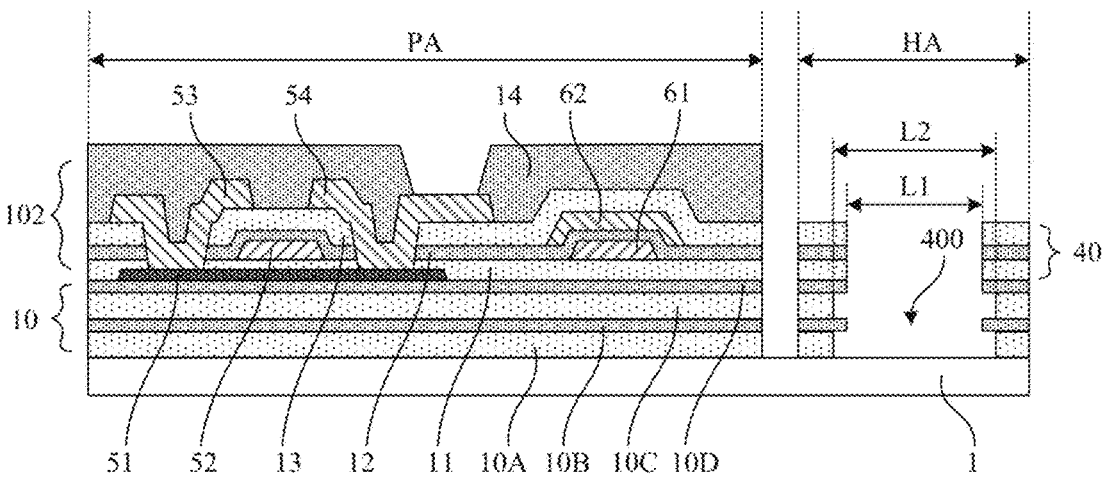
FIG. 10 is a schematic diagram after a pattern of a drive circuit layer is formed according to an exemplary embodiment of the present disclosure.

So far, a pattern of the drive circuit layer 102 disposed on the base substrate 10 is completed through preparation in the PA region, as shown in FIG. 10. In the exemplary implementation mode, the active layer 51, the gate electrode 52, the source electrode 53, and the drain electrode 54 together constitute the transistor 101A, and the first capacitor electrode 61 and the second capacitor electrode 62 together constitute the storage capacitor 101B. In an exemplary implementation mode, the transistor may be a drive transistor in the pixel drive circuit. The drive transistor may be a Thin Film Transistor (TFT).

In an exemplary implementation mode, the through hole 400 of the HA region is composed of multiple film layers provided with openings, and the multiple film layers may be divided into an inorganic material film layer and an organic material film layer. The inorganic material film layer may include a first inorganic layer 10B, a second inorganic layer 10D, a first insulation layer 11, a second insulation layer 12, and a third insulation layer 13, and widths L1 of openings on multiple inorganic material film layers are substantially the same. The organic material film layer may include a first flexible layer 10A and a second flexible layer 10C, and widths L2 of openings on multiple organic material film layers are substantially the same. In an exemplary implementation mode, a width L1 of an opening on an inorganic material film layer is smaller than a width L2 of an opening on an organic material film layer due to an etching factor, i.e. an orthographic projection of the opening on the organic material film layer on a plane of the display substrate contains an orthographic projection of the opening on the inorganic material film layer on the plane of the display substrate, so that an inner wall of the through hole 400 has a concave-convex structure. In an exemplary implementation mode, a difference between the width L2 and the width L1 may be about 0.6 μm to 1.4 μm, i.e., on one side of the through hole 400, an inner wall of the opening on the organic material film layer protrudes from 0.3 μm to 0.7 μm relative to an inner wall of the opening on the inorganic material film layer.

In an exemplary implementation mode, a first insulation layer, a second insulation layer, and a third insulation layer may be made of any one or more of Silicon Oxide (SiOx), Silicon Nitride (SiNx) and Silicon OxyNitride (SiON), and may be a single layer, a multi-layer, or a composite layer. The first insulation layer and the second insulation layer are referred to as Gate Insulator (GI) layers, and the third insulation layer is referred to as an Interlayer Dielectric (ILD) layer. The planarization thin film may be made of an organic material such as resin. The first metal thin film, the second metal thin film, and the third metal thin film may be made of a metal material, such as any one or more of silver (Ag), copper (Cu), aluminum (Al), titanium (Ti), and molybdenum (Mo), or an alloy material of the above metals, such as an Aluminum-Neodymium alloy (AlNd) or a Molybdenum-Niobium alloy (MoNb), and may be of a single-layer structure or a multi-layer composite structure, such as Ti/Al/Ti. An active layer thin film may be made of an amorphous Indium Gallium Zinc Oxide (a-IGZO), Zinc OxyNitride (ZnON), Indium Zinc Tin Oxide (IZTO), amorphous Silicon (a-Si), polycrystalline Silicon (p-Si), hexathiophene, polythiophene, and other materials, that is, the present disclosure is applicable to transistors manufactured based on an oxide technology, a silicon technology, and an organic matter technology.

In an exemplary implementation mode, the drive circuit layer 102 may include a fourth insulation layer, which may cover the pattern of the third metal layer, the planarization layer is disposed on the fourth insulation layer, and the fourth insulation layer is referred to as a Passivation (PVX) layer.

Figure 11:
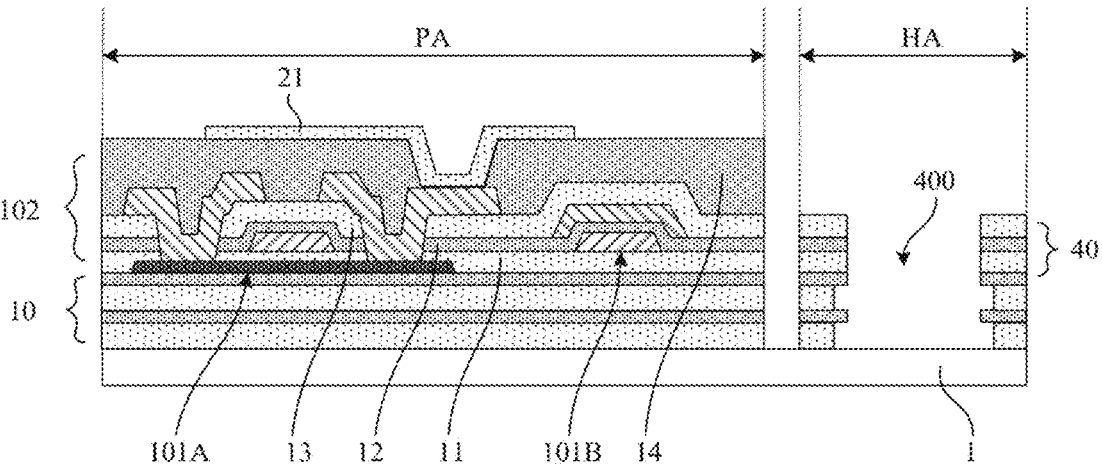
FIG. 11 is a schematic diagram after a pattern of an anode is formed according to an exemplary embodiment of the present disclosure.

> (3) A pattern of an anode is formed. In an exemplary implementation mode, forming the pattern of the anode may include: depositing a conductive thin film on the base substrate on which the aforementioned patterns are formed, patterning the conductive thin film through a patterning process to form a pattern of an anode 21, the anode 21 is formed in the PA region, and the anode 21 is connected with a drain electrode of a transistor 210 through the anode via, as shown in FIG. 11. After this process, the conductive thin film deposited in the HA region is etched away, and the structure of HA region is the same as that after a previous process.

In an exemplary implementation mode, a material of the conductive thin film may be a metal material or a transparent conductive material, and the metal material may include any one or more of silver (Ag), copper (Cu), aluminum (Al), titanium (TI), and molybdenum (Mo), or an alloy material of the above metals, and the transparent conductive material may include Indium Tin Oxide (ITO) or Indium Zinc Oxide (IZO). In an exemplary implementation mode, the conductive thin film may have a single-layer structure or a multi-layer composite structure, such as ITO/Al/ITO.

Figure 12:
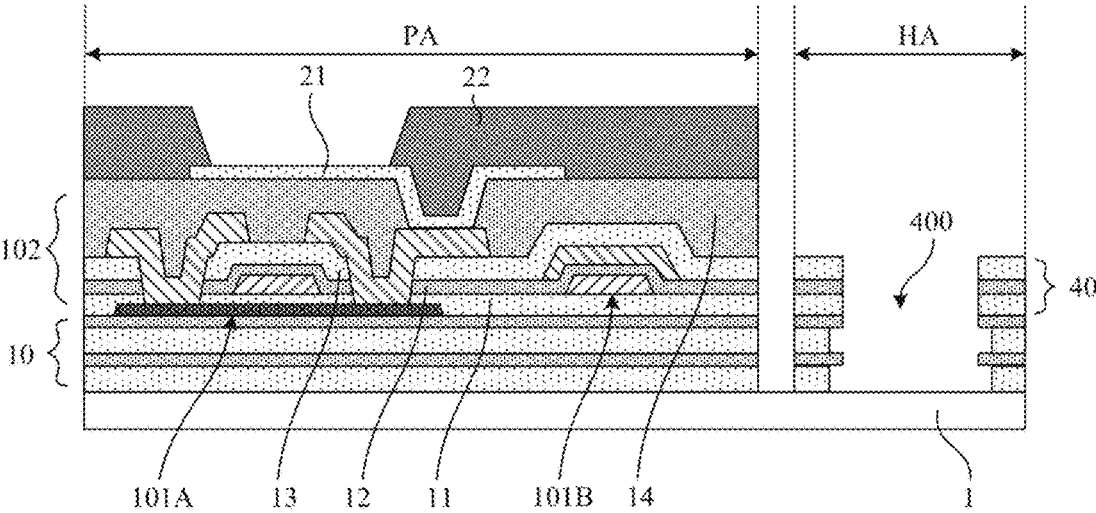
FIG. 12 is a schematic diagram after a pattern of a pixel definition layer is formed according to an exemplary embodiment of the present disclosure.

> (5) A pattern of a pixel definition layer is formed. In an exemplary implementation mode, forming the pattern of the pixel definition layer may include: coating a pixel definition thin film on the base substrate on which the aforementioned patterns are formed; patterning the pixel definition thin film through a patterning process, so as to form a pattern of a Pixel Definition Layer (PDL) 22. The pattern of the pixel definition layer 22 is formed in the PA region, and a pixel opening is formed thereon, and the pixel definition layer in the pixel opening is removed to expose a surface of the anode 21, as shown in FIG. 12. After this process, the pixel definition thin film coated on the HA region is removed, and the structure of the HA region is the same as that after a previous process.

In an exemplary implementation mode, the pixel definition layer may be made of polyimide, acrylic, polyethylene terephthalate, or the like. In a plane parallel to the display substrate, a shape of the pixel opening may be a triangle, a rectangle, a polygon, a circle, an ellipse, or the like. In a plane perpendicular to the display substrate, a cross-sectional shape of the pixel opening may be a rectangle, a trapezoid, or the like.

Figure 13:
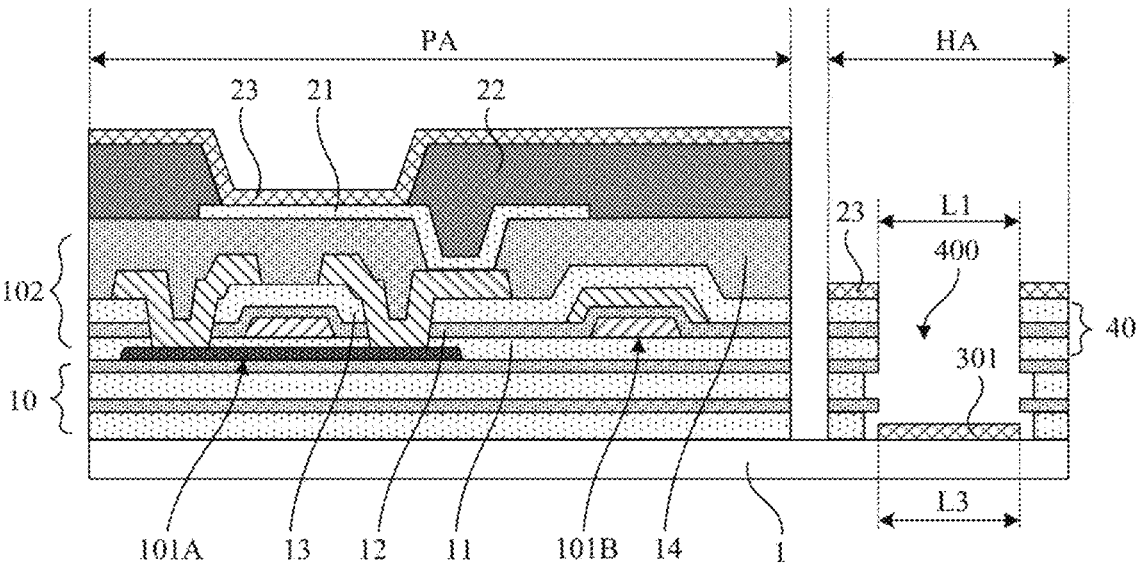
FIG. 13 is a schematic diagram after a pattern of an organic emitting layer is formed according to an exemplary embodiment of the present disclosure.

> (6) A pattern of an organic emitting layer is formed. In an exemplary implementation mode, forming the pattern of the organic emitting layer a may include: forming patterns of an organic emitting layer 23 and an organic emitting block 301 by means of evaporation or ink-jet printing on the base substrate on which the aforementioned patterns are formed. The organic emitting layer 23 located in the PA region is connected with the anode 21 through the pixel opening, and the organic emitting layer 23 located in the HA region is provided on the third insulation layer 13 outside the through hole 400. The organic emitting block 301 is located in the HA region, and is formed on the glass carrier plate 1 in the through hole 400, that is, the organic emitting block 301 is located inside the through hole 400 on a side away from the composite insulation layer 40, or the organic emitting block 301 is located on a side of the composite insulation layer 40 in a direction to the base substrate 10, as shown in FIG. 13.

In an exemplary implementation mode, the organic emitting layer 23 and the organic emitting block 301 are disposed in a same layer, have a same material, and are formed through a same process.

In an exemplary implementation mode, the inner wall of the through hole 400 has a concave-convex structure and the inorganic material film layer protrudes from the organic material film layer for a distance, so an organic emitting material is disconnected at the inner wall of the through hole 400. The organic emitting block 301 is formed on the glass carrier plate 1 at a bottom of the through hole 400, and the organic emitting layer 23 is formed in a region outside the through hole 400, so that the organic emitting block 301 and the organic emitting layer 23 in the HA region are arranged in isolation from each other.

In the exemplary implementation mode, a width L3 of the organic emitting block 301 formed at the bottom of the through hole 400 may be made approximately equal to a width L1 of the opening on the inorganic material film layer through an evaporation process and an ink-jet printing process, that is, an orthographic projection of the organic emitting block 301 on the base substrate is substantially equal to an orthographic projection of the opening on the inorganic material film layer on the base substrate. In an exemplary implementation mode, the width L3 of the organic emitting block 301 formed at the bottom of the through hole 400 may be made slightly larger than the width L1 of the opening on the inorganic material film layer through a flow effect of liquid droplets in the ink-jet printing process, and the present disclosure is not limited herein.

In a display substrate, an organic emitting material is usually evaporated in a display region, but an organic emitting material is not evaporate in a non-display region, and the organic emitting material evaporated in the display region is usually evaporated in a pixel area, and an organic emitting material is not evaporated in part of hole areas of the display region. Since there is no organic emitting material formed in part of the hole areas of the display substrate, an inorganic encapsulation layer formed subsequently is directly deposited on a glass base substrate at a bottom of a through hole, which leads to a case where a part of the inorganic encapsulation layer cannot be separated from the glass base substrate in a lift-off process. In an exemplary embodiment of the present disclosure, organic emitting blocks are formed in through holes of the display region and the non-display region, so that an inorganic encapsulation layer formed subsequently is formed on the organic emitting blocks. Since the organic emitting material is easily separated from the glass base substrate, a situation that a film layer cannot be lifted off during a lifting process of the display substrate and a glass carrier plate is effectively avoided.

In an exemplary implementation mode, a through hole formed with an organic emitting block may be any one or more of following: a through hole in a display region, a through hole in a circuit region, a through hole in an encapsulation region, and a through hole in a bezel region. For example, by modifying a fine metal mask plate used in evaporation, evaporation openings are arranged at positions of through holes in the display region, the circuit region, the encapsulation region, and the bezel region, so that an organic emitting material is evaporated in a corresponding through hole, and an organic emitting block is formed on a glass carrier plate at a bottom of the through hole.

In an exemplary implementation mode, a width of a through hole in the non-display region may be set to be larger than a width of a through hole in the display region, so that an organic emitting block with a relatively large size may be formed in the through hole in the non-display region, further avoiding a case where a film layer cannot be lifted off during the lifting process of the display substrate and the glass carrier plate.

In an exemplary implementation mode, the width of the through hole in the display region may be about 10 μm to 20 μm, and the width of the through hole in the non-display region may be about 25 μm to 45 μm.

In an exemplary implementation mode, in a plane parallel to the display substrate, a shape of the through hole in the display region and a shape of the through hole in the non-display region may be the same, or a shape of the through hole in the display region may be different from a shape of the through hole in the non-display region. The present disclosure is not limited herein.

In an exemplary implementation mode, the organic emitting layer may include an Emitting Layer (EML) and any one or more of following: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation mode, the organic emitting layer may be prepared through evaporation using a Fine Metal Mask (FMM) or an open mask, or through an ink-jet process.

In an exemplary implementation mode, the organic emitting layer may be prepared through a following preparation method. First, a hole injection layer and a hole transport layer are sequentially evaporated by using an open mask, and a common layer of the hole injection layer and the hole transport layer is formed on the display substrate. Then, by using a fine metal mask, an electron block layer and a red emitting layer are evaporated in a red sub-pixel, an electron block layer and a green emitting layer are evaporated in a green sub-pixel, and an electron block layer and a blue emitting layer are evaporated in a blue sub-pixel. Electron block layers and emitting layers of adjacent sub-pixels may be overlapped slightly (for example, an overlapping portion accounts for less than 10% of an area of a pattern of a respective emitting layer), or may be isolated. Then, a hole block layer, an electron transport layer, and an electron injection layer are sequentially evaporated by using an open mask, and a common layer of the hole block layer, the electron transport layer, and the electron injection layer is formed on the display substrate.

In an exemplary implementation mode, an electron block layer may be used as a micro-cavity adjustment layer of a light emitting device. By designing a thickness of an electron block layer, a thickness of an organic emitting layer between a cathode and an anode may satisfy a design for a length of a micro-cavity. In some exemplary implementation modes, a hole transport layer, a hole block layer, or an electron transport layer in an organic emitting layer may be used as a micro-cavity adjustment layer of a light emitting device, which is not limited in the present disclosure.

In an exemplary implementation mode, the emitting layer may include a host material and a dopant material doped into the host material. A doping ratio of the dopant material of the emitting layer is 1% to 20%. Within a range of the doping ratio, on one hand, the host material of the emitting layer may effectively transfer exciton energy to the dopant material of the emitting layer to excite the dopant material of the emitting layer to emit light; on the other hand, the host material of the emitting layer "dilutes" the dopant material of the emitting layer, thus effectively improving collisions between molecules of the dopant material of the emitting layer and fluorescence quenching caused by collisions between energy, and improving a luminous efficiency and device life. In an exemplary implementation mode, the doping ratio refers to a ratio of a mass of the dopant material to a mass of the emitting layer, that is, a mass percentage. In an exemplary implementation mode, the host material and the dopant material may be co-evaporated through a multi-source evaporation process, so that the host material and the dopant material are uniformly dispersed in the emitting layer. A doping ratio may be adjusted by controlling an evaporation rate of the dopant material or by controlling an evaporation rate ratio of the host material to the dopant material during an evaporation process. In an exemplary implementation mode, a thickness of the emitting layer may be about 10 nm to 50 nm.

In an exemplary implementation mode, the hole injection layer may be made of an inorganic oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide, or may be made of a p-type dopant of a strongly electron-withdrawing system and a dopant of a hole transport material. In an exemplary implementation mode, a thickness of the hole injection layer may be about 5 nm to 20 nm.

In an exemplary implementation mode, the hole transport layer may be made of a material with a relatively high hole mobility, such as an aromatic amine compound, and its substituent group may be carbazole, methylfluorene, spiro-fluorene, dibenzothiophene, or furan, etc. In an exemplary implementation mode, a thickness of the hole transport layer may be about 40 nm to 150 nm.

In an exemplary implementation mode, the hole block layer and the electron transport layer may be made of aromatic heterocyclic compounds, such as benzimidazole derivatives, imidazopyridine derivatives, benzimidazo-phenanthridine derivatives, and other imidazole derivatives; pyrimidine derivatives, triazine derivatives, and other oxazine derivatives;

compounds having a nitrogen-containing six-membered ring structure (also including a compound having a phosphine oxide-based substituent on a heterocyclic ring) such as quinoline derivatives, isoquinoline derivatives, and phenanthroline derivatives. In an exemplary implementation mode, a thickness of the hole block layer may be about 5 nm to 15 nm, and a thickness of the electron transport layer may be about 20 nm to 50 nm.

In an exemplary implementation mode, the electron injection layer may be made of an alkali metal or a metal, such as lithium fluoride (LiF), ytterbium (Yb), magnesium (Mg), or Calcium (Ca), or a compound of these alkali metals or metals. In an exemplary implementation mode, a thickness of the electron injection layer may be about 0.5 nm to 2 nm.

Figure 14:
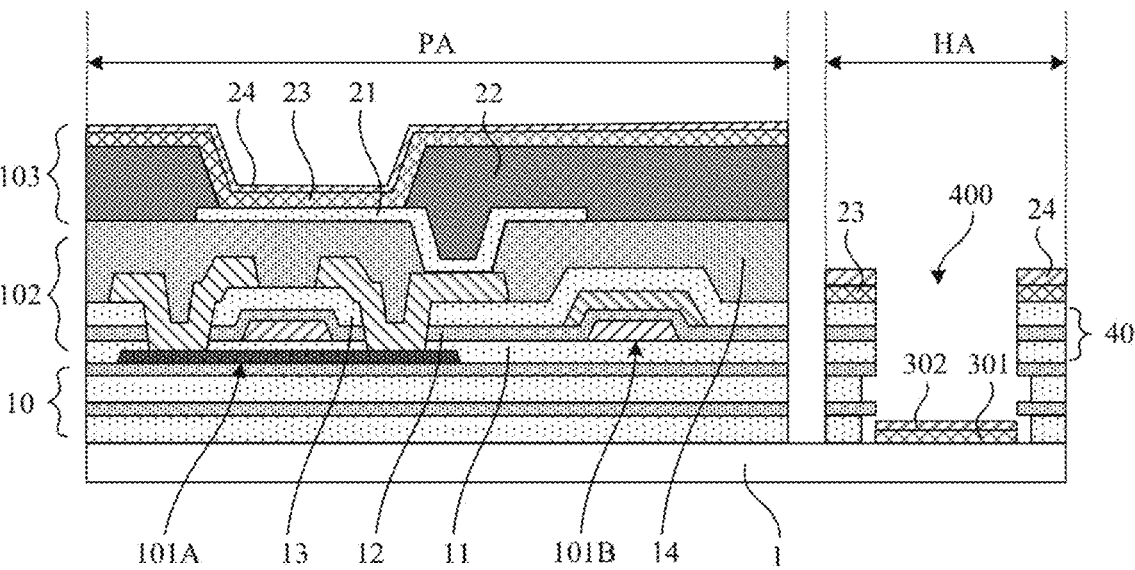
FIG. 14 is a schematic diagram after a pattern of a cathode is formed according to an exemplary embodiment of the present disclosure.

(7) A pattern of a cathode is formed. In an exemplary implementation mode, forming the pattern of the cathode may include: forming patterns of a cathode 24 and a cathode block 302 by means of evaporation on the base substrate on which the aforementioned patterns are formed. The cathode 24 located in the PA region is disposed on the organic emitting layer 23, the cathode 24 located in the HA region is disposed on the organic emitting layer 23 outside the through hole 400, the cathode block 302 is formed in the HA region, and the cathode block 302 is formed on the organic emitting block 301 inside the through hole 400, as shown in FIG. 14.

In an exemplary implementation mode, the cathode 24 and the cathode block 302 are disposed in a same layer, have a same material, and are formed through a same process.

In an exemplary implementation mode, the cathode 24 may be of an integral structure that is communicated together. In an exemplary implementation mode, since an inner wall of a stretch hole 300 has a concave-convex structure and an inorganic material film layer protrudes from an organic material film layer for a distance, a cathode material is disconnected at an inner wall of a through hole 400, and a cathode block 302 is formed on an organic emitting block 301 at a bottom of the through hole 400, and a cathode 24 is formed on the organic emitting layer 23 in a region outside the through hole 400, so that the cathode block 302 and the cathode 24 in the HA region are arranged in isolation from each other.

In an exemplary implementation mode, a width of the cathode block 302 may be equal to a width L2 of an opening on the organic material film layer, i.e. a width of the cathode block 302 may be equal to a width of the organic emitting block 301.

In a display substrate, a cathode material is usually evaporated in a display region and a circuit region of a non-display region, and a cathode material is not evaporated in an encapsulation region and a bezel region of the non-display region, so that a cathode block is formed in a part of through holes in the display substrate, and a cathode block is not formed in another part of the through holes. In an exemplary implementation mode, a through hole formed with a cathode block 302 may be any one or more of following: a through hole in a display region, a through hole in a circuit region, a through hole in an encapsulation region, and a through hole in a bezel region. The present disclosure is not limited herein.

So far, preparation of the pattern of the light emitting structure layer 103 is completed on the drive structure layer 102 of the PA region. The light emitting structure layer 103 includes an anode, a pixel definition layer, an organic emitting layer, and a cathode, and the organic emitting layer is respectively connected with the anode and the cathode.

Figure 15:
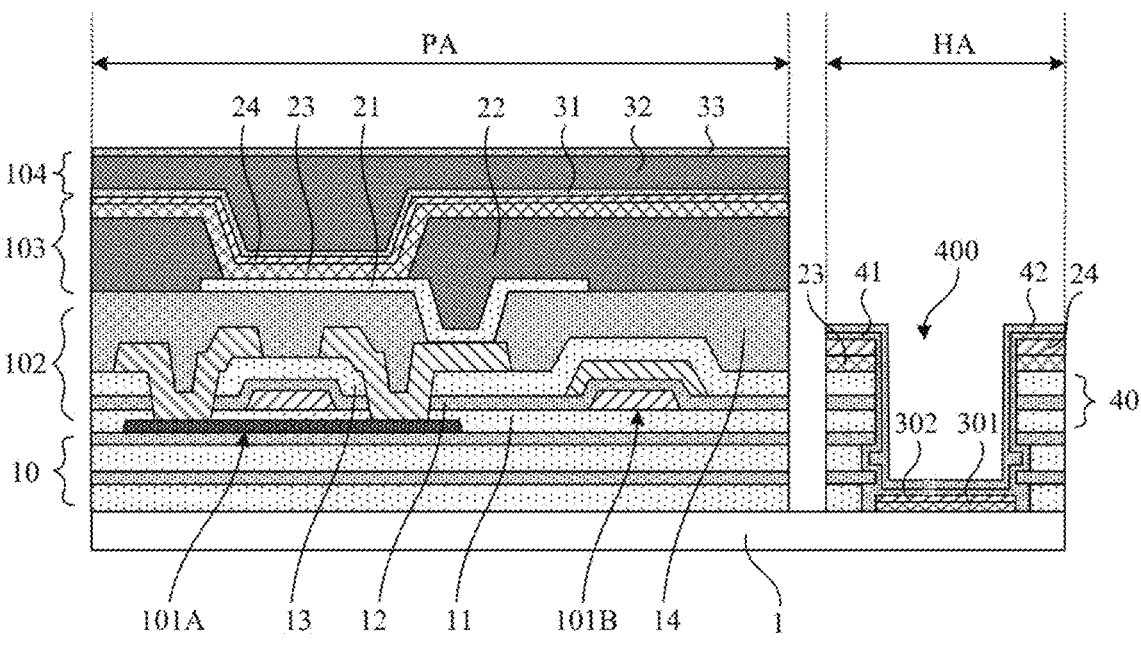
FIG. 15 is a schematic diagram after a pattern of an encapsulation layer is formed according to an exemplary embodiment of the present disclosure.

(8) A pattern of an encapsulation layer is formed. In an exemplary implementation mode, forming the pattern of the encapsulation layer may include: firstly depositing a first encapsulation thin film by means of deposition using an open mask to form a first encapsulation layer 31 in the PA region and form a first inorganic encapsulation layer 41 in the HA region. Subsequently, an organic encapsulation material is ink-jet printed on the first encapsulation layer 31 of the PA region using an ink-jet printing process, and after curing to form a film, an organic encapsulation layer 32 is formed. Subsequently, a second encapsulation thin film is deposited using an open mask, a second encapsulation layer 33 is formed in the PA region, a second inorganic encapsulation layer 42 is formed in the HA region, the first encapsulation layer 31, the organic encapsulation layer 32, and the second encapsulation layer 33 in the PA region form the encapsulation layer, and the first inorganic encapsulation layer 41 and the second inorganic encapsulation layer 42 in the HA region form an inorganic encapsulation layer, as shown in FIG. 15.

In the exemplary implementation mode, the first encapsulation layer 31 and the first inorganic encapsulation layer 41 are arranged in a same layer, have a same material, and are formed through a same process, and the second encapsulation layer 33 and the second inorganic encapsulation layer 42 are arranged in a same layer, have a same material, and are formed through a same process.

In an exemplary implementation mode, the inorganic encapsulation layer formed in the HA region is of an integral structure, covering an exposed surface of a through hole 400, i.e. the inorganic encapsulation layer covers a concave-convex inner wall of the through hole 400, an organic emitting block 301 and a cathode block 302 at a bottom of the through hole 400, and the glass substrate 1 exposed at the bottom of the through hole 400.

In an exemplary implementation mode, the first encapsulation thin film and the second encapsulation thin film may be made of any one or more of Silicon Oxide (SiOx), Silicon Nitride (SiNx), and Silicon OxyNitride (SiON), and may be a single layer, a multi-layer, or a composite layer. The organic encapsulation material may be made of a resin material to form a laminated structure of inorganic material/organic material/inorganic material in the PA region. An organic material layer is arranged between two inorganic material layers, and a laminated structure of inorganic material/inorganic material is formed in the HA region, which may ensure that external water vapor cannot enter the light emitting structure layer So far, preparation of a pattern of an encapsulation layer 104 is completed on the light emitting structure layer 103 of the PA region. Preparation of a hole structure layer is completed in the HA region. The encapsulation layer 104 may include a first encapsulation layer, an organic encapsulation layer, and a second encapsulation layer which are stacked, and the hole structure layer may include a composite insulation layer 40, an organic emitting layer 23, a cathode 24, an organic emitting block 301, a cathode block 302, and an inorganic encapsulation layer. The inorganic encapsulation layer includes a first inorganic encapsulation layer 41 and a second inorganic encapsulation layer 42.

In an exemplary implementation mode, the composite insulation layer 40 of the HA region is provided on a side of the base substrate 10 away from the glass substrate 1 (first direction D1), and a through hole is provided on the base substrate 10 and the composite insulation layer 40. The organic emitting layer 23 of the HA region is provided on a side of the composite insulation layer 40 outside the through hole away from the glass substrate 1, and the cathode 24 of the HA region is provided on a side of the organic emitting layer 23 outside a through hole away from the glass substrate 1. The organic emitting block 301 is provided on the glass substrate 1 at a bottom of a through hole, and the cathode block 302 is provided on a side of the organic emitting block 301 at a bottom of a through hole away from the glass substrate 1. The first inorganic encapsulation layer 41 covers the organic emitting layer 23 and the cathode 24, covers an inner wall of a through hole, covers the organic emitting block 301 and the cathode block 302 at a bottom of the through hole, and covers the glass substrate 1 exposed at the bottom of the through hole, respectively. The second inorganic encapsulation layer 42 covers the first inorganic encapsulation layer 41.

In an exemplary implementation mode, after preparation of the encapsulation layer is completed, a touch structure layer (TSP) may be formed on an encapsulation layer of the PA region, and the touch structure layer may include a touch electrode layer, or include a touch electrode layer and a touch insulation layer, which is not limited in the present disclosure.

Figure 16:
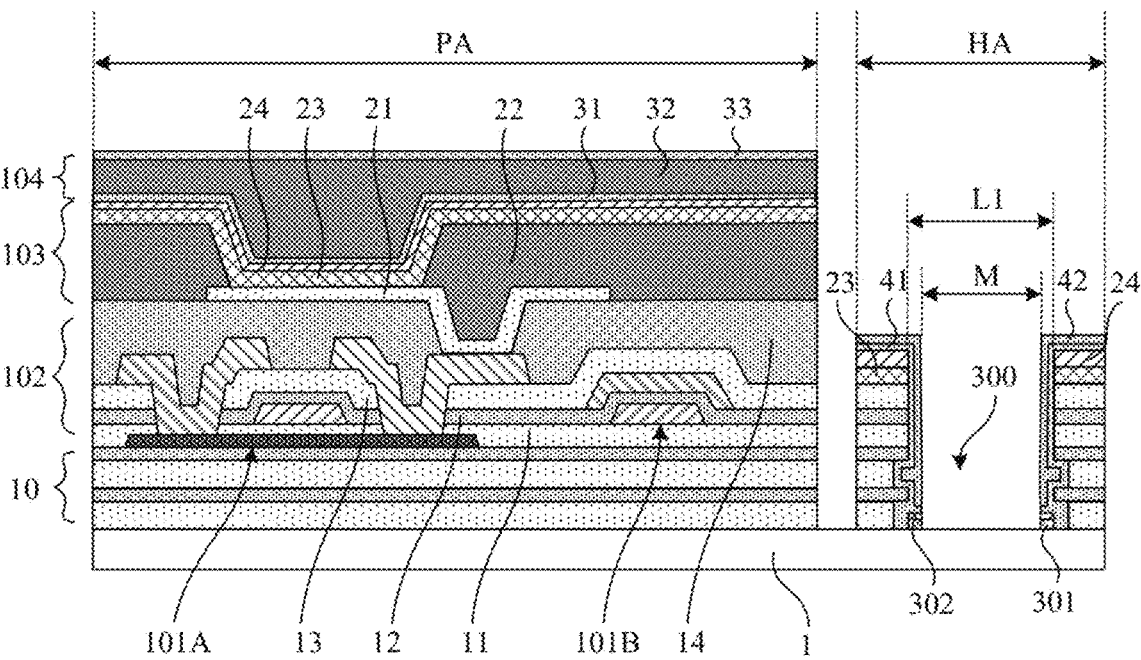
FIG. 16 is a schematic diagram after a pattern of a stretch hole is formed according to an exemplary embodiment of the present disclosure.

(9) A pattern of a stretch hole is formed. In an exemplary implementation mode, forming the pattern of the stretch hole may include: coating a photoresist on the base substrate on which the aforementioned patterns are formed, forming a photoresist pattern through masking, exposure, and development, and etching a film layer at a bottom of a through hole 400 through an etching process to form a pattern of a stretch hole 300, as shown in FIG. 16.

In an exemplary implementation mode, since widths of the organic emitting block 301 and the cathode block 302 are approximately equal to the width L1 of the opening on the inorganic material film layer, while the inorganic encapsulation layer covers the inner wall of the through hole 400, etching of the etching process is basically performed along a surface of the inorganic encapsulation layer covering the inner wall of the through hole 400, so a width M of the stretch hole 300 finally formed by etching is smaller than the width L1 of the opening on the inorganic material film layer, that is, the width M of the stretch hole 300 is smaller than the width L1 of the organic emitting block 301 and the cathode block 302. In this way, after the stretch hole 300 is formed by etching, the inner wall of the stretch hole 300 may include an organic material inner wall section formed by the organic emitting block 301, a conductive material inner wall section formed by the cathode block 302, and an inorganic material inner wall section formed by the inorganic encapsulation layer. The conductive material inner wall section is located on a side of the inorganic material inner wall section adjacent to the glass substrate 1, and the organic material inner wall section is located on a side of the conductive material inner wall section adjacent to the glass substrate 1.

In an exemplary implementation mode, forming the stretch hole 300 through the etching process may be understood as opening an inorganic encapsulation hole on the inorganic encapsulation layer, opening a cathode block hole on the cathode block 302, opening an emitting block hole on the organic emitting block 301. The inorganic encapsulation hole, the cathode block hole, and the emitting block hole are communicated with each other and communicated with a through hole whose inner wall is covered by the inorganic encapsulation layer. The emitting block hole, the cathode block hole, the inorganic encapsulation hole, and the through hole whose inner wall is covered by the inorganic encapsulation layer together form the stretch hole 300. The inorganic encapsulation layer may include a first inorganic encapsulation layer 41 and a second inorganic encapsulation layer 42 that are stacked, and the inorganic encapsulation hole may include a first encapsulation hole provided on the first inorganic encapsulation layer 41 and a second encapsulation hole provided on the second inorganic encapsulation layer 42, and the first encapsulation hole and the second encapsulation hole are communicated with each other. In an exemplary implementation mode, an inner wall of the first encapsulation hole, an inner wall of the second encapsulation hole, and a second inorganic encapsulation layer covering the through hole together form an inorganic material inner wall section, an inner wall of the cathode block hole forms a conductive material inner wall section, and an inner wall of the emitting block hole forms an organic material inner wall section.

In an exemplary implementation mode, when a cathode block is not formed in a through hole, an inner wall of a stretch hole does not have to contain a conductive material inner wall, and an organic material inner wall section is located on a side of an inorganic material inner wall section adjacent to a glass substrate.

In an exemplary implementation mode, in a plane parallel to the display substrate, a width of a stretch hole in the non-display region may be greater than a width of a stretch hole in the display region, and the width of the stretch hole refers to a dimension perpendicular to an extension direction of a strip-shaped stretch hole. The width of the stretch hole in the display region may be 5 μm to 15 μm, and the width of the stretch hole in the non-display region may be 20 μm to 40 μm. For example, the width of the stretch hole in the display region may be 10 μm, and the width of the stretch hole in the non-display region may be 30 μm.

(10) A display carrier plate is lifted off. In an exemplary implementation mode, lifting the display carrier plate may include: lifting off the display substrate from the glass substrate through a laser lift-off process.

In the exemplary embodiment of the present disclosure, an organic emitting block is formed inside a through hole, so that an inorganic encapsulation layer formed subsequently is formed on the organic emitting block. When a stretch hole is formed by etching, even if the inorganic encapsulation layer at a bottom of the stretch hole is not completely etched off and a part of the inorganic encapsulation layer remains, the remaining inorganic encapsulation layer is arranged on the organic emitting block. Because of relatively weak adhesion between an organic emitting material and a glass substrate, the organic emitting material is easily separated from the glass substrate in a laser lift-off process.

In an exemplary implementation mode, during preparation of a flexible display substrate, a preparation process of the display substrate may include processes such as attaching of a back film, and cutting, which is not limited in the present disclosure.

As may be seen from a structure of the display substrate and the preparation process of the exemplary embodiment of the present disclosure that, in the exemplary embodiment of the present disclosure, the organic emitting block is formed in the stretch hole, so that the subsequently formed inorganic encapsulation layer is disposed on the organic light-emitting block, which not only avoids a situation that a film layer of the display substrate cannot be separated from the glass substrate, but also avoids occurrence of pulling cracks in the inorganic encapsulation layer, thus effectively ensuring an encapsulation effect of the display substrate.

Figure 17:
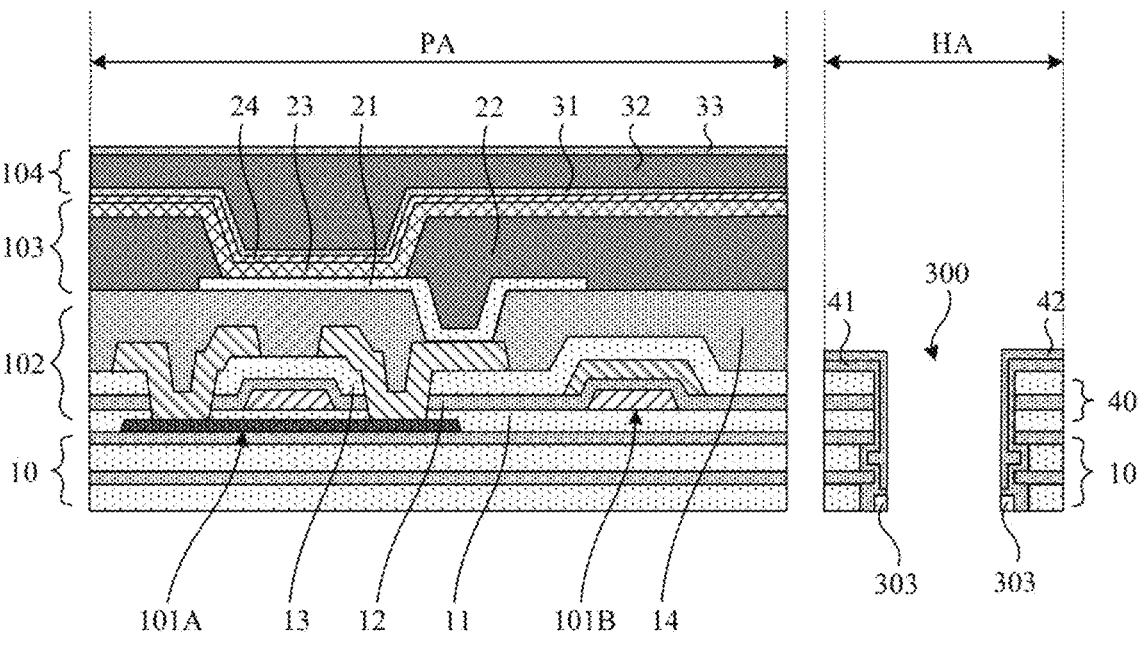
FIG. 17 is a schematic diagram of a structure of another display substrate according to an exemplary embodiment of the present disclosure.

FIG. 17 is a schematic diagram of a structure of another display substrate according to an exemplary embodiment of the present disclosure, wherein a cross-sectional structure of a pixel area PA and a hole area HA in the display substrate is illustrated. In the exemplary implementation mode, a structure of this exemplary embodiment is similar to the structure shown in FIG. 8, a difference is that a hole structure layer of the hole area HA in this exemplary embodiment includes an organic material block 303 on which a material block hole is provided, and an inner wall of the material block hole forms an organic material inner wall section.

As shown in FIG. 17, the hole structure layer of the hole area HA may include a composite insulation layer 40, an organic material block 303, and an inorganic encapsulation layer. The organic material block 303 is disposed in a through hole, and is located on a side of the hole structure layer away from the composite insulation layer 40 along a direction from the composite insulation layer 40 to a base substrate 10, and a material block hole is provided on the organic material block 303. The inorganic encapsulation layer is provided on the composite insulation layer 40 outside the through hole, provided on the organic material block 303 in the through hole, and provided on an inner wall of the through hole, respectively. An inorganic encapsulation hole is provided on the inorganic encapsulation layer.

In an exemplary implementation mode, the material block hole provided on the organic material block 303, the inorganic encapsulation hole provided on the inorganic encapsulation layer, and the through hole whose inner wall is covered by the inorganic encapsulation layer are communicated with each other and together form a stretch hole 300. An inner wall of the inorganic encapsulation hole and the inorganic encapsulation layer covering the inner wall of the through hole together form an inorganic material inner wall section, and an inner wall of the material block hole forms an organic material inner wall section.

In an exemplary implementation mode, the organic material block 303 in the through hole is prepared separately, and a material of the organic material block 303 may be a small molecular organic material, such as 4,4'-N,N'-dicarbazolyl biphenyl.

In the exemplary implementation mode, structures of the base substrate, a display structure layer of the pixel area PA, the composite insulation layer 40 and the inorganic encapsulation layer of the hole area HA are similar to those of the foregoing embodiments and will not be repeated here.

In an exemplary implementation mode, a preparation process of this exemplary embodiment is similar to that of the foregoing embodiments, a difference is that after a pattern of a pixel definition layer is formed, a small molecule organic material is sprayed on all hole areas of the display substrate by means of ink-jet printing, and an organic material block 303 is formed on a glass carrier plate at a bottom of a through hole, that is, the organic material block 303 is located on a side of the through hole away from the composite insulation layer 40, and a thickness of the organic material block 303 may be about 50 nm to 350 nm. After the organic material block 303 is formed in the through hole, an organic emitting layer, a cathode, an encapsulation layer, and the like are prepared. That is to say, an act of separately forming the organic material block in the through hole is added into the preparation process of this exemplary embodiment. In this way, a fine metal mask used in evaporation of the organic emitting layer does not have to be changed, and a high cost of modifying the fine metal mask may be saved.

In the exemplary embodiment of the present disclosure, an organic material block is formed in a through hole, so that an inorganic encapsulation layer formed subsequently is formed on the organic material block. When a stretch hole is formed by etching, even if the inorganic encapsulation layer at a bottom of the stretch hole is not completely etched off and a part of the inorganic encapsulation layer remains, the remaining inorganic encapsulation layer is arranged on the organic material block. Because of relatively weak adhesion between the small molecule organic material and the glass substrate, the organic material is easily separated from the glass substrate in a laser lift-off process, which not only avoids a situation that a film layer of the display substrate cannot be separated from the glass substrate, but also avoids occurrence of pulling cracks in the inorganic encapsulation layer, thus effectively ensuring an encapsulation effect of the display substrate.

Figure 18:
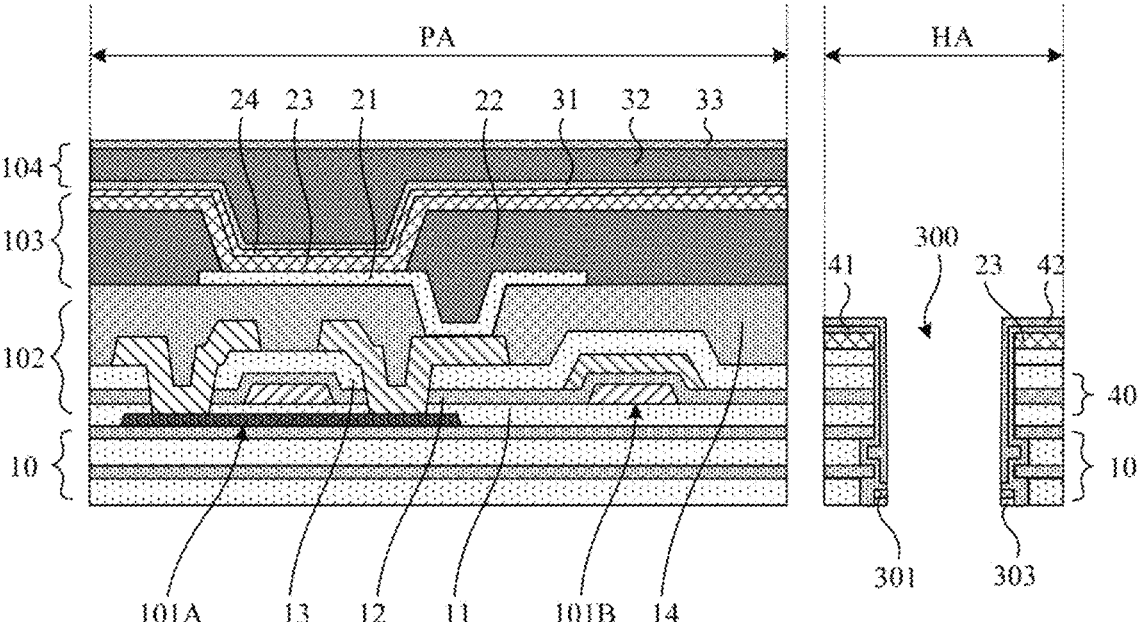
FIG. 18 is a schematic diagram of a structure of yet another display substrate according to an exemplary embodiment of the present disclosure.

FIG. 18 is a schematic diagram of a structure of yet another display substrate according to an exemplary embodiment of the present disclosure, wherein a cross-sectional structure of a pixel area PA and a hole area HA in the display substrate is illustrated. In an exemplary implementation mode, a structure of this exemplary embodiment is similar to that shown in FIG. 8. A difference is that a hole structure layer of the hole area HA in this exemplary embodiment includes an organic emitting block 301 and an organic material block 303. The organic emitting block 301 is provided on the organic material block 303, an emitting block hole is provided on the organic emitting block 301, a material block hole is provided on the organic material block 303, and an inner wall of the emitting block hole and an inner wall of the material block hole together form an organic material inner wall section.

As shown in FIG. 18, the hole structure layer of the hole area HA may include a composite insulation layer 40, an organic emitting layer 23, the organic material block 303, the organic emitting block 301, and an inorganic encapsulation layer. The organic material block 303 is disposed in a through hole, and is located on a side of the hole structure layer away from the composite insulation layer 40 along a direction from the composite insulation layer 40 to a base substrate 10, and a material block hole is provided on the organic material block 303. The organic emitting block 301 is provided on the organic material block 303 in the through hole, and an emitting block hole is provided on the organic emitting block 301. The inorganic encapsulation layer is provided on the organic emitting layer 23 outside the through hole, provided on the organic emitting block 301 in the through hole, and provided on an inner wall of the through hole, respectively. An inorganic encapsulation hole is provided on the inorganic encapsulation layer.

In an exemplary implementation mode, the material block hole provided on the organic material block 303, the emitting block hole provided on the organic emitting block 301, the inorganic encapsulation hole provided on the inorganic encapsulation layer, and the through hole whose inner wall is covered by the inorganic encapsulation layer are communicated with each other to form a stretch hole 300 together. An inner wall of the inorganic encapsulation hole and the inorganic encapsulation layer covering an inner wall of the through hole form an inorganic material inner wall section, and an inner wall of the emitting block hole and an inner wall of the material block hole form an organic material inner wall section.

In an exemplary implementation mode, the organic material block 303 in the through hole is prepared separately, and a material of the organic material block 303 may be a small molecular organic material, such as 4,4'-N,N'-dicarbazolyl biphenyl.

In the exemplary implementation mode, structures of the base substrate, a display structure layer of the pixel area PA, the composite insulation layer 40 of the hole area HA, and the inorganic encapsulation layer are similar to those of the foregoing embodiments and will not be repeated here.

In an exemplary implementation mode, the preparation process of this exemplary embodiment is similar to that of the forgoing embodiments. A difference is that after a pattern of a pixel definition layer is formed, a small molecule organic material is sprayed on all hole areas of the display substrate by means of ink-jet printing, and an organic material block 303 is formed on a glass carrier plate at a bottom of the through hole, that is, the organic material block 303 is located on a side of the through hole away from the composite insulation layer 40, and a thickness of the organic material block 303 may be about 50 nm to 350 nm. Subsequently, patterns of an organic emitting layer 23 and an organic emitting block 301 are formed by means of evaporation or ink-jet printing, and the organic emitting block 301 is formed on the organic material block 303 in the through hole. Subsequently, a cathode, an encapsulation layer, and the like are prepared.

In the exemplary embodiment of the present disclosure, an organic material block and an organic emitting block is formed in a through hole, so that the inorganic encapsulation layer formed subsequently is formed on the organic material block and the organic emitting block. When a stretch hole is formed by etching, even if the inorganic encapsulation layer at a bottom of the stretch hole is not completely etched off and a part of the inorganic encapsulation layer remains, the remaining inorganic encapsulation layer is arranged on the organic material block and the organic emitting block. Because of relatively weak adhesion between a small molecule organic material and a glass substrate, the organic material is easily separated from the glass substrate in a laser lift-off process, which not only avoids a situation that a film layer of the display substrate cannot be separated from the glass substrate, but also avoids occurrence of pulling cracks in the inorganic encapsulation layer, thus effectively ensuring an encapsulation effect of the display substrate.

Figure 19:
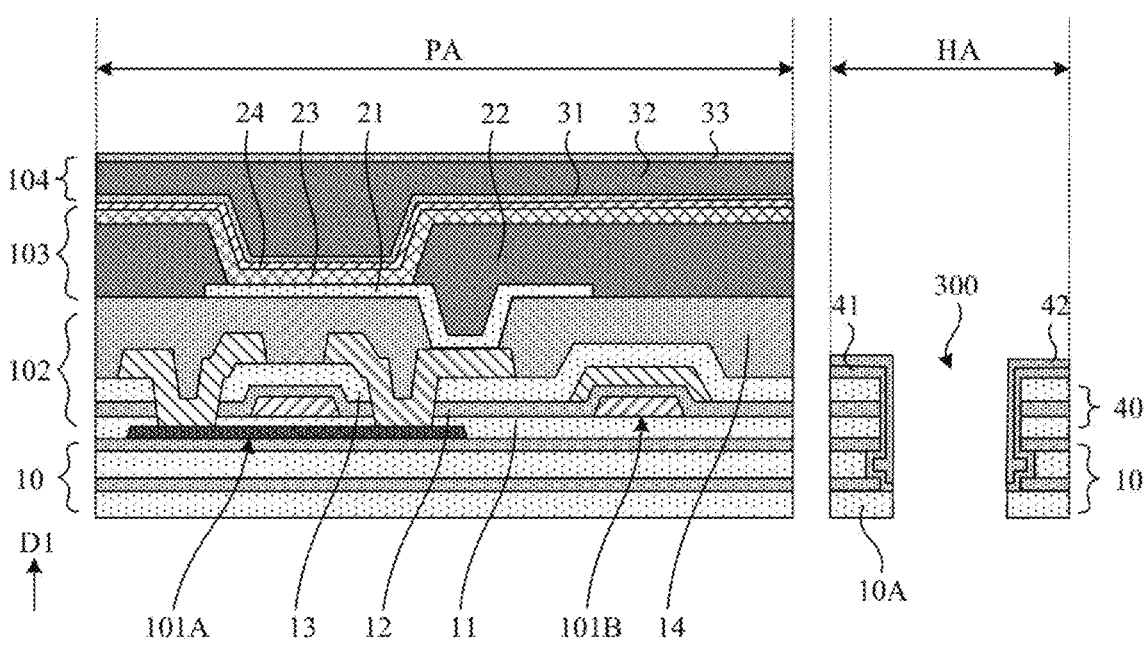
FIG. 19 is a schematic diagram of a structure of yet another display substrate according to an exemplary embodiment of the present disclosure.

FIG. 19 is a schematic diagram of a structure of yet another display substrate according to an exemplary embodiment of the present disclosure, wherein a cross-sectional structure of a pixel area PA and a hole area HA in the display substrate is illustrated. As shown in FIG. 19, in an exemplary implementation mode, the display substrate may include a pixel area PA and a hole area HA, the pixel area PA includes a base substrate and a display structure layer disposed on the base substrate and the hole area HA includes the base substrate and a hole structure layer disposed on the base substrate. The hole area HA further includes at least one stretch hole 300 penetrating through the base substrate and the hole structure layer. In an exemplary implementation mode, an inner wall of a stretch hole 300 that penetrating through the base substrate and the hole structure layer is an inner wall with a composite structure, which includes an inorganic material inner wall section formed by an inorganic material film layer and an organic material inner wall section formed by an organic material film layer. In a plane perpendicular to the display substrate, the inorganic material inner wall section and the organic material inner wall section are arranged along a first direction D1.

In an exemplary implementation mode, the display structure layer of the pixel area PA is substantially similar to that of the foregoing embodiments. The hole structure layer of the hole area HA may include a composite insulation layer 40 and an inorganic encapsulation layer. The composite insulation layer 40 is disposed on one side of the base substrate 10 in the first direction D1, a first flexible hole is disposed on a first flexible layer 10A in the base substrate 10, a blind hole is provided on another film layer and the composite insulation layer 40 in the base substrate 10, an inorganic encapsulation layer covers an inner wall of the blind hole and the first flexible layer 10A, and an inorganic encapsulation hole is provided on the inorganic encapsulation layer.

In an exemplary implementation mode, the first flexible hole, the inorganic encapsulation hole, and the blind hole whose inner wall is covered by the inorganic encapsulation layer are communicated with each other and together form the stretch hole 300.

In an exemplary implementation mode, an inner wall of the inorganic encapsulation hole and the inorganic encapsulation layer covering an inner wall of a through hole together form an inorganic material inner wall section, and an inner wall of the first flexible hole forms an organic material inner wall section.

In an exemplary implementation mode, a preparation process of the display substrate according to the exemplary embodiment include following operations.

(11) A process of forming a pattern of the base substrate is the same as that in the foregoing embodiments.

Figure 20:
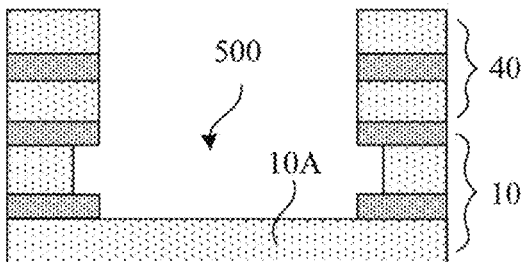
FIG. 20 is a schematic diagram of a structure of a hole area after a pattern of a drive circuit layer is formed according to an exemplary embodiment of the present disclosure.

(12) In a process of forming a pattern of a drive circuit layer on the base substrate, a process of forming a semiconductor layer, a first insulation layer 11, a first metal layer, a second insulation layer 12, a second metal layer, a third metal layer, and a planarization layer 14 is the same as that in the forgoing embodiments. What's different from the forgoing embodiments is that, in a process of forming a third insulation layer 13, a blind hole 500 is formed in an HA region. The third insulation layer 13, the second insulation layer 12, the first insulation layer 11, a second inorganic layer, a second flexible layer, and a first inorganic layer in the blind hole 500 are removed, exposing a surface of the first flexible layer 10A. That is, the first flexible layer 10A is retained in this process, as shown in FIG. 20, which only shows a structure of a hole area.

In an exemplary implementation mode, the blind hole 500 of the HA region is composed of multiple film layers provided with openings, and the multiple film layers may be divided into an inorganic material film layer and an organic material film layer. The inorganic material film layer may include a first inorganic layer 10B, a second inorganic layer 10D, a first insulation layer 11, a second insulation layer 12, and a third insulation layer 13, and widths L1 of openings on the multiple inorganic material film layers are substantially the same. The organic material film layer may include a second flexible layer 10C, and an orthographic projection of an opening on the organic material film layer on a plane of the display substrate contains an orthographic projection of an opening on the inorganic material film layer on the plane of the display substrate, so that an inner wall of the blind hole 500 has a concave-convex structure.

In an exemplary implementation mode, the blind hole may be any one or more of following: a blind hole in a display region, a blind hole in a circuit region, a blind hole in an encapsulation region, and a blind hole in a bezel region.

Figure 21:
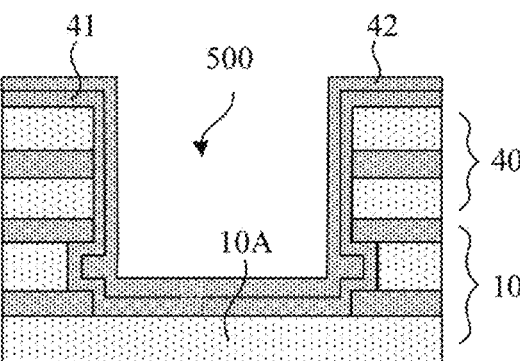
FIG. 21 is a schematic diagram of a structure of a hole area after a pattern of an inorganic encapsulation layer is formed according to an exemplary embodiment of the present disclosure.

(13) A process of forming patterns of an anode, a pixel definition layer, an organic emitting layer, a cathode, and an encapsulation layer is substantially similar to that of the foregoing embodiments. A difference is that an organic emitting block and a cathode block are not formed in the blind hole 500 when the organic emitting layer and the cathode are formed, and the inorganic encapsulation layer formed in the HA region covers the inner wall of the blind hole 500 and the first flexible layer 10A at a bottom of the blind hole 500, as shown in FIG. 21, which illustrates only a structure of a hole area.

(14) A pattern of a stretch hole is formed. In an exemplary implementation mode, forming the pattern of the stretch hole may include: coating a photoresist on the base substrate on which the aforementioned patterns are formed, forming a photoresist pattern through masking, exposure, and development, and etching film layers at the bottom of the blind hole 500 sequentially through an etching process. A second encapsulation hole is formed on the second inorganic encapsulation layer 42, a first encapsulation hole is formed on the first inorganic encapsulation layer 41, and a first flexible hole is formed on the first flexible layer 10A. The second encapsulation hole, the first encapsulation hole, and the first flexible hole are communicated with each other and communicated with a blind hole whose inner wall is covered by the inorganic encapsulation layer. The first flexible hole, the first encapsulation hole, the second encapsulation hole, and the blind hole whose inner wall is covered by the inorganic encapsulation layer together form a stretch hole 300, as shown in FIG. 19.

In a display substrate, a through hole is usually formed in an HA region before deposition of an inorganic encapsulation layer, so that the formed inorganic encapsulation layer is directly deposited on a glass substrate at a bottom of a through hole, resulting in a situation in which a part of the inorganic encapsulation layer cannot be separated from the glass substrate in a lift-off process. In the exemplary embodiment of the present disclosure, by forming blind holes in HA regions of the display region and the non-display region, the inorganic encapsulation layer formed subsequently is formed on the first flexible layer. Since the first flexible layer is easily separated from the glass substrate, a situation that a film layer cannot be lifted off during a lifting process of the display substrate and the glass carrier plate is effectively avoided.

(15) A display carrier plate is lifted off. In an exemplary implementation mode, lifting off the display carrier plate may include: lifting off the display substrate from the glass substrate through a laser lift-off process.

In the exemplary embodiment of the present disclosure, firstly a blind hole is formed, so that an inorganic encapsulation layer formed subsequently is formed on a first flexible layer. When a stretch hole is formed by etching, even if an inorganic encapsulation layer at a bottom of the stretch hole is not completely etched away, and a part of the inorganic encapsulation layer remains, the remaining inorganic encapsulation layer is arranged on the first flexible layer, since the first flexible layer is easily separated from a glass substrate, a situation that a film layer cannot be lifted off during a lifting process of the display substrate and a glass carrier plate is effectively avoided, which not only avoids a situation that a film layer of the display substrate cannot be separated from the glass substrate, but also avoids occurrence of pulling cracks in the inorganic encapsulation layer, thus effectively ensuring an encapsulation effect of the display substrate.

Figure 22:
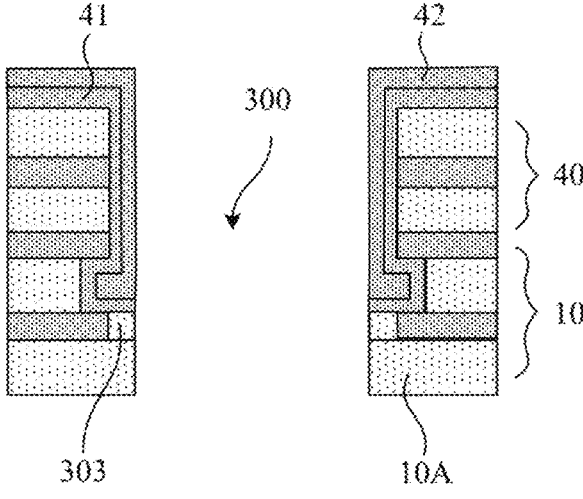
FIG. 22 is a schematic diagram of a structure of yet another display substrate according to an exemplary embodiment of the present disclosure.

FIG. 22 is a schematic diagram of a structure of yet another display substrate according to an exemplary embodiment of the present disclosure, wherein a cross-sectional structure of a hole area in the display substrate is illustrated. In an exemplary implementation mode, a structure of this exemplary embodiment is similar to that shown in FIG. 19, a difference is that a hole structure layer of the hole area in this exemplary embodiment includes an organic material block 303. A first flexible hole is provided on a first flexible layer 10A, a material block hole is provided on the organic material block 303, and an inner wall of the first flexible hole and an inner wall of the material block hole form an organic material inner wall section.

As shown in FIG. 22, the hole structure layer of the hole area may include a composite insulation layer 40, the organic material block 303, and an inorganic encapsulation layer. The organic material block 303 is disposed on the first flexible layer 10A at a bottom of a blind hole, and a material block hole is provided on the organic material block 303. The inorganic encapsulation layer is provided on the composite insulation layer 40 outside the blind hole, provided on the organic material block 303 in the blind hole, and provided on an inner wall of the blind hole, respectively. An inorganic encapsulation hole is provided on the inorganic encapsulation layer.

In an exemplary implementation mode, the first flexible hole, the material block hole, the inorganic encapsulation layer, and the blind hole whose inner wall is covered by the inorganic encapsulation layer are communicated with each other and together form a stretch hole 300. An inner wall of the inorganic encapsulation hole and the inorganic encapsulation layer covering the blind hole form an inorganic material inner wall section, and an inner wall of the first flexible hole and an inner wall of the material block hole form an organic material inner wall section.

In the exemplary implementation mode, a preparation process of this exemplary embodiment is similar to that of the foregoing embodiments, a difference is that after a pattern of a pixel definition layer is formed, a small molecule organic material is sprayed on all hole areas of the display substrate by means of ink-jet printing, and an organic material block 303 is formed on the first flexible layer 10A at the bottom of the blind hole. After the organic material block 303 is formed in the blind hole, an organic emitting layer, a cathode, an encapsulation layer, and the like are prepared, and an inorganic encapsulation layer formed in a hole area covers the inner wall of the blind hole and the organic material block 303 at the bottom of the blind hole. Subsequently, film layers at the bottom of the blind hole are etched in turn through an etching process. A second encapsulation hole is formed on the second inorganic encapsulation layer 42, a first encapsulation hole is formed on the first inorganic encapsulation layer 41, a material block hole is formed on the organic material block 303, and a first flexible hole is formed on the first flexible layer 10A. The second encapsulation hole, the first encapsulation hole, the material block hole, and the first flexible hole are communicated with each other and communicated with a blind hole whose inner wall is covered by the inorganic encapsulation layer, and together form a stretch hole 300.

Figure 23:
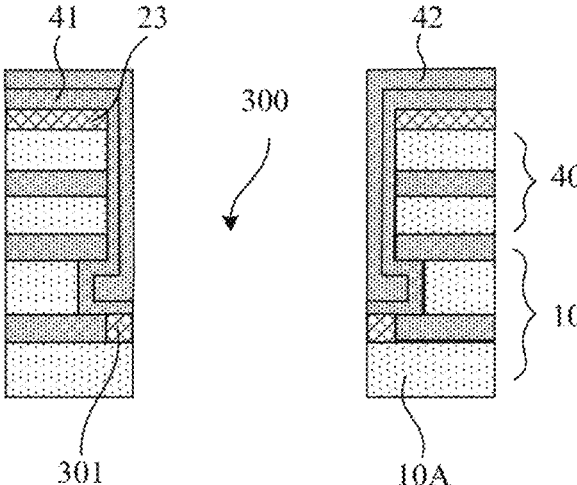
FIG. 23 is a schematic diagram of a structure of yet another display substrate according to an exemplary embodiment of the present disclosure.

FIG. 23 is a schematic diagram of a structure of yet another display substrate according to an exemplary embodiment of the present disclosure, wherein a cross-sectional structure of a hole area in the display substrate is illustrated. In an exemplary implementation mode, a structure of this exemplary embodiment is similar to that shown in FIG. 19, a difference is that a hole structure layer of the hole area in this exemplary embodiment includes an organic emitting block 301. A first flexible hole is provided on the first flexible layer 10A, a material block hole is provided on the organic emitting block 301, and an inner wall of the first flexible hole and an inner wall of the material block hole form an organic material inner wall section.

As shown in FIG. 23, the hole structure layer in the hole area may include a composite insulation layer 40, an organic emitting layer 23, an organic emitting block 301, and an inorganic encapsulation layer, The organic emitting block 301 is disposed on the first flexible layer 10A at a bottom of a blind hole, and an emitting block hole is provided on the organic emitting block 301. The inorganic encapsulation layer is provided on the organic emitting layer 23 outside the blind hole, provided on the organic emitting block 301 in the blind hole, and provided on an inner wall of the blind hole, respectively. An inorganic encapsulation hole is provided on the inorganic encapsulation layer.

In an exemplary implementation mode, the first flexible hole, the emitting block hole, the inorganic encapsulation layer, and the blind hole whose inner wall is covered by the inorganic encapsulation layer are communicated with each other and together form a stretch hole 300. An inner wall of the inorganic encapsulation hole and the inorganic encapsulation layer covering the blind hole form an inorganic material inner wall section, and an inner wall of the first flexible hole and an inner wall of the emitting block hole form an organic material inner wall section.

In the exemplary implementation mode, a preparation process of this exemplary embodiment is similar to that of the foregoing embodiments, a difference is that in a process of forming a pattern of an organic emitting layer, the organic emitting layer 23 is formed in a pixel area, the organic emitting layer 23 is formed on the third insulation layer outside a blind hole in the hole area, and the organic emitting block 301 is formed on the first flexible layer 10A at a bottom of the blind hole. Then, a cathode and an encapsulation layer are prepared, and the inorganic encapsulation layer formed in the hole area covers the inner wall of the blind hole and the organic emitting block 301 at the bottom of the blind hole. Subsequently, film layers at the bottom of the blind hole are etched in turn through an etching process. A second encapsulation hole is formed on the second inorganic encapsulation layer 42, a first encapsulation hole is formed on the first inorganic encapsulation layer 41, an emitting block hole is formed on the organic emitting block 301, and a first flexible hole is formed on the first flexible layer 10A. The second encapsulation hole, the first encapsulation hole, the emitting block hole, and the first flexible hole are communicated with each other and communicated with a blind hole whose inner wall is covered by the inorganic encapsulation layer, and together form a stretch hole 300.

Figure 24:
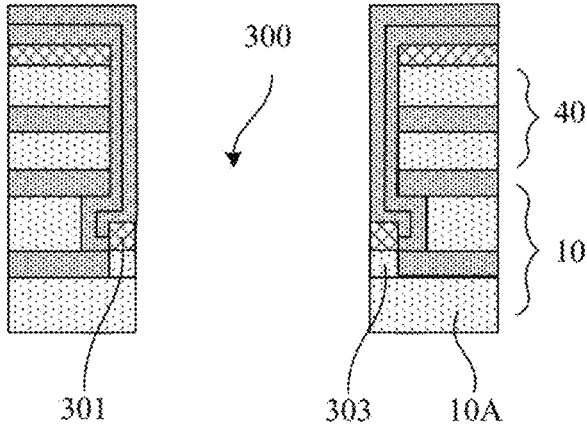
FIG. 24 is a schematic diagram of a structure of yet another display substrate according to an exemplary embodiment of the present disclosure.

FIG. 24 is a schematic diagram of a structure of yet another display substrate according to an exemplary embodiment of the present disclosure, wherein a cross-sectional structure of a hole area in the display substrate is illustrated. In an exemplary implementation mode, a structure of this exemplary embodiment is similar to that shown in FIGS. 22 and 23, a difference is that in this exemplary implementation mode, a hole structure layer of the hole area includes an organic material block 303 and an organic emitting block 301. A first flexible hole is provided on a first flexible layer 10A, a material block hole is provided on the organic material block 303, and a material block hole is provided on the organic emitting block 301. An inner wall of the first flexible hole, an inner wall of the material block hole, and an inner wall of the emitting block hole together form an organic material inner wall section.

As shown in FIG. 24, the hole structure layer in the hole area may include a composite insulation layer 40, an organic material block 303, an organic emitting block 301, and an inorganic encapsulation layer. The organic material block 303 is disposed on the first flexible layer 10A at a bottom of a blind hole, and a material block hole is provided on the organic material block 303. The organic emitting block 301 is provided on the organic material block 303 at the bottom of the blind hole, and a material block hole is provided on the organic emitting block 301. The inorganic encapsulation layer is provided on the organic emitting layer 23 outside the blind hole, provided on the organic emitting block 301 inside the blind hole, and provided on an inner wall of the blind hole, respectively. An inorganic encapsulation hole is provided on the inorganic encapsulation layer.

In an exemplary implementation mode, the first flexible hole, the material block hole, the emitting block hole, the inorganic encapsulation layer, and the blind hole whose inner wall is covered by the inorganic encapsulation layer are communicated with each other and together form a stretch hole 300. An inner wall of the inorganic encapsulation hole and the inorganic encapsulation layer covering the blind hole form an inorganic material inner wall section, and an inner wall of the first flexible hole, an inner wall of the material block hole, and an inner wall of the emitting block hole form an organic material inner wall section.

In the exemplary implementation mode, a preparation process of this exemplary embodiment is similar to that of the foregoing embodiments, including: after a pattern of a pixel definition layer is formed, a small molecule organic material is sprayed on all hole areas of the display substrate by means of ink-jet printing, and an organic material block 303 is formed on a first flexible layer 10A at a bottom of a blind hole. Subsequently, a process of a pattern of an organic emitting layer is performed to form an organic emitting layer 23 in a pixel area. The organic emitting layer 23 is formed on a third insulation layer outside a blind hole in the hole area, and an organic emitting block 301 is formed on the organic material block 303 at the bottom of the blind hole. Then, a cathode and an encapsulation layer are prepared, and the inorganic encapsulation layer formed in the hole area covers an inner wall of the blind hole and the organic emitting block 301 at the bottom of the blind hole. Subsequently, film layers at the bottom of the blind hole are sequentially etched through an etching process. a second encapsulation hole is formed on the second inorganic encapsulation layer 42, a first encapsulation hole is formed on the first inorganic encapsulation layer 41, an emitting block hole is formed on the organic emitting block 301, a material block hole is formed on the organic material block 303, and a first flexible hole is formed on the first flexible layer 10A. The second encapsulation hole, the first encapsulation hole, the emitting block hole, the material block hole, and the first flexible hole are communicated with each other, and communicated with the blind hole whose inner wall is covered by the inorganic encapsulation layer, forming the stretch hole 300 together.

It should be noted that structures and preparation processes shown in the exemplary embodiments of the present disclosure are merely exemplary descriptions, and corresponding structures may be changed and patterning processes may be increased or decreased according to actual needs, which are not limited herein.

An exemplary embodiment of the present disclosure further provides a preparation method of a display substrate, the display substrate includes a pixel area and a hole area, and the preparation method includes following acts.

S1, forming a display structure layer disposed on a base substrate in the pixel area and forming a hole structure layer disposed on the base substrate in the hole area.

S2, forming at least one stretch hole penetrating through the base substrate and the hole structure layer in the hole area, wherein an inner wall of the stretch hole includes an inorganic material inner wall section and an organic material inner wall section, the inorganic material inner wall section and the organic material inner wall section are arranged along a direction from the base substrate to the hole structure layer, and the organic material inner wall section is located on a side of the stretch hole away from the hole structure layer.

In an exemplary implementation mode, the forming the hole structure layer disposed on the base substrate in the hole area, may include: forming a base substrate including a first flexible layer, a first inorganic layer, a second flexible layer, and a second inorganic layer that are stacked, wherein a first inorganic opening is provided on the first inorganic layer; forming a composite insulation layer on the base substrate, wherein a through hole or a blind hole is provided on the base substrate and the composite insulation layer; the through hole penetrates through the composite insulation layer and the base substrate, and the blind hole penetrates through the first inorganic layer, the second flexible layer, and the second inorganic layer in the composite insulation layer and the base substrate; forming an organic emitting block at a bottom of the through hole or the blind hole, or forming an organic material block, or sequentially forming an organic material block and an organic emitting block; and forming an inorganic encapsulation layer in the through hole or the blind hole, wherein the inorganic encapsulation layer covers an inner wall of the through hole or the blind hole and covers the organic emitting block or the organic material block.

In an exemplary implementation mode, the display structure layer includes a light emitting structure layer disposed on the base substrate and an encapsulation layer disposed on the light emitting structure layer; the light emitting structure layer includes an organic emitting layer, and the encapsulation layer includes a first encapsulation layer, an organic encapsulation layer, and a second encapsulation layer which are stacked; the inorganic encapsulation layer includes a first inorganic encapsulation layer and a second inorganic encapsulation layer which are stacked; the organic emitting block and the organic emitting layer are arranged in a same layer and are formed through a same process; the first inorganic encapsulation layer and the first encapsulation layer are arranged in a same layer and are formed through a same process; the second inorganic encapsulation layer and the second encapsulation layer are arranged in a same layer and are formed through a same process.

In an exemplary implementation mode, the forming at least one stretch hole penetrating through the base substrate and the hole structure layer in the hole area, may include: etching the inorganic encapsulation layer and the organic emitting block in the through hole through a patterning process to form an emitting block hole and an inorganic encapsulation hole communicated with each other, wherein the emitting block hole is arranged on the organic emitting block and the inorganic encapsulation hole is arranged on the inorganic encapsulation layer; wherein an inner wall of the inorganic encapsulation hole and the inorganic encapsulation layer covering an inner wall of the through hole form the inorganic material inner wall section, and an inner wall of the emitting block hole forms the organic material inner wall section.

In an exemplary implementation mode, the forming at least one stretch hole penetrating through the base substrate and the hole structure layer in the hole area, may include: etching the inorganic encapsulation layer and the organic material block in the through hole through a patterning process to form a material block hole and an inorganic encapsulation hole communicated with each other, wherein the material block hole is arranged on the organic emitting block and the inorganic encapsulation hole is arranged on the inorganic encapsulation layer; wherein an inner wall of the inorganic encapsulation hole and the inorganic encapsulation layer covering an inner wall of the through hole form the inorganic material inner wall section, and an inner wall of the material block hole forms the organic material inner wall section.

In an exemplary implementation mode, the forming at least one stretch hole penetrating through the base substrate and the hole structure layer in the hole area, may include: etching the inorganic encapsulation layer, the organic emitting block, and the organic material block in the through hole through a patterning process to form a material block hole, an emitting block hole, and an inorganic encapsulation hole which are mutually communicated, wherein the material block hole is arranged on the organic emitting block, the emitting block hole is arranged on the organic emitting block, and the inorganic encapsulation hole is arranged on the inorganic encapsulation layer; wherein an inner wall of the inorganic encapsulation hole and the inorganic encapsulation layer covering an inner wall of the through hole form the inorganic material inner wall section, and an inner wall of the material block hole and an inner wall of the emitting block hole form the organic material inner wall section.

In an exemplary implementation mode, the forming at least one stretch hole penetrating through the base substrate and the hole structure layer in the hole area, may include: etching the inorganic encapsulation layer, the organic emitting block, and the first flexible layer in the blind hole through a patterning process to form a first flexible hole, an emitting block hole, and an inorganic encapsulation hole which are mutually communicated, wherein the first flexible hole is arranged on the first flexible layer, the emitting block hole is arranged on the organic emitting block, and the inorganic encapsulation hole is arranged on the inorganic encapsulation layer; wherein an inner wall of the inorganic encapsulation hole and the inorganic encapsulation layer covering an inner wall of the blind hole form the inorganic material inner wall section, and an inner wall of the first flexible hole and an inner wall of the emitting block hole form the organic material inner wall section.

In an exemplary implementation mode, the forming at least one stretch hole penetrating through the base substrate and the hole structure layer in the hole area, may include: etching the inorganic encapsulation layer, the organic material block, and the first flexible layer in the blind hole through a patterning process to form a first flexible hole, a material block hole, and an inorganic encapsulation hole communicated with each other, wherein the first flexible hole is arranged on the first flexible layer, the material block hole is arranged on the organic material block, and the inorganic encapsulation hole is arranged on the inorganic encapsulation layer; an inner wall of the inorganic encapsulation hole and the inorganic encapsulation layer covering an inner wall of the blind hole form the inorganic material inner wall section, and an inner wall of the first flexible hole and an inner wall of the material block hole form the organic material inner wall section.

In an exemplary implementation mode, the forming at least one stretch hole penetrating through the base substrate and the hole structure layer in the hole area, may include: etching the inorganic encapsulation layer, the organic emitting block, the organic material block, and the first flexible layer in the blind hole through a patterning process to form a first flexible hole, a material block hole, an emitting block hole, and an inorganic encapsulation hole communicated with each other, wherein the first flexible hole is arranged on the first flexible layer, the material block hole is arranged on the organic material block, the emitting block hole is arranged on the organic emitting block, and the inorganic encapsulation hole is arranged on the inorganic encapsulation layer; an inner wall of the inorganic encapsulation hole and the inorganic encapsulation layer covering an inner wall of the blind hole form the inorganic material inner wall section, and an inner wall of the first flexible hole, an inner wall of the material block hole, and an inner wall of the emitting block hole form the organic material inner wall section.

In this embodiment, structures, materials, relevant parameters, and detailed preparation processes of various film layers have been described in detail in the foregoing embodiments, and will not be repeated here.

An exemplary embodiment of the present disclosure provides a preparation method of a display substrate. By forming an organic material in a stretch hole, an inorganic encapsulation layer formed subsequently is arranged on the organic material, which not only avoids a situation that a film layer of the display substrate cannot be separated from a glass substrate, but also avoids occurrence of pulling cracks in the inorganic encapsulation layer, thus effectively ensuring an encapsulation effect of the display substrate. The preparation method of the present disclosure has little improvement to existing processes and can be well compatible with an existing preparation process, so the process is simple to implement, easy to implement, high in production efficiency, and has advantages of easy process implementation, a low production cost, and a high yield, etc.

An exemplary embodiment of the present disclosure further provides a display apparatus, which includes the display substrate in the foregoing embodiments. The display apparatus may be any product or component with a display function, such as a mobile phone, a tablet computer, a television, a display, a laptop computer, a digital photo frame, and a navigator.

Although the implementation modes disclosed in the present disclosure are as above, the described contents are only implementation modes used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate comprising a pixel area and a hole area, wherein the pixel area comprises a display structure layer arranged on a base substrate, the hole area comprises a hole structure layer; the hole area comprises at least one stretch hole penetrating through the base substrate and the hole structure layer; an inner wall of the stretch hole comprises an inorganic material inner wall section and an organic material inner wall section, the inorganic material inner wall section and the organic material inner wall section are arranged along a direction from the base substrate to the hole structure layer, and the organic material inner wall section is located on a side of the stretch hole away from the hole structure layer, wherein the display substrate comprises a display region and a non-display region, and the stretch hole comprises a stretch hole in the display region and a stretch hole in the non-display region.

2. The display substrate according to claim 1, wherein the hole structure layer comprises a composite insulation layer, an organic emitting block, and an inorganic encapsulation layer; the composite insulation layer is arranged on the base substrate, and a through hole is provided on the base substrate and the composite insulation layer; the organic emitting block is arranged in the through hole, and the inorganic encapsulation layer covers an inner wall of the through hole and the organic emitting block; an emitting block hole is arranged on the organic emitting block, and an inorganic encapsulation hole is arranged on the inorganic encapsulation layer; the stretch hole comprises the emitting block hole, the inorganic encapsulation hole, and the through hole whose inner wall is covered by the inorganic encapsulation layer, which are mutually communicated, wherein an inner wall of the inorganic encapsulation hole and the inorganic encapsulation layer covering the inner wall of the through hole form the inorganic material inner wall section, and an inner wall of the emitting block hole forms the organic material inner wall section.

3. The display substrate according to claim 1, wherein the hole structure layer comprises a composite insulation layer, an organic material block, and an inorganic encapsulation layer; the composite insulation layer is arranged on the base substrate, and a through hole is provided on the base substrate and the composite insulation layer; the organic material block is arranged in the through hole, and the inorganic encapsulation layer covers an inner wall of the through hole and the organic material block; a material block hole is provided on the organic material block, and an inorganic encapsulation hole is provided on the inorganic encapsulation layer; the stretch hole comprises the material block hole, the inorganic encapsulation hole, and the through hole whose inner wall is covered by the inorganic encapsulation layer, which are mutually communicated, wherein an inner wall of the inorganic encapsulation hole and the inorganic encapsulation layer covering the inner wall of the through hole form the inorganic material inner wall section, and an inner wall of the material block hole forms the organic material inner wall section.

4. The display substrate according to claim 1, wherein the hole structure layer comprises a composite insulation layer, an organic material block, an organic emitting block, and an inorganic encapsulation layer; the composite insulation layer is arranged on the base substrate, and a through hole is provided on the base substrate and the composite insulation layer; the organic material block is arranged in the through hole, the organic emitting block is arranged on the organic material block, and the inorganic encapsulation layer covers an inner wall of the through hole and the organic emitting block; a material block hole is provided on the organic material block, an emitting block hole is provided on the organic emitting block, and an inorganic encapsulation hole is provided on the inorganic encapsulation layer; the stretch hole comprises the material block hole, the emitting block hole, the inorganic encapsulation hole, and the through hole whose inner wall is covered by the inorganic encapsulation layer, which are mutually communicated, wherein an inner wall of the inorganic encapsulation hole and the inorganic encapsulation layer covering the inner wall of the through hole form the inorganic material inner wall section, and an inner wall of the material block hole and an inner wall of the emitting block hole form the organic material inner wall section.

5. The display substrate according to claim 1, wherein the base substrate comprises a first flexible layer, a first inorganic layer disposed on the first flexible layer, a second flexible layer disposed on a side of the first inorganic layer away from the first flexible layer, and a second inorganic layer disposed on a side of the second flexible layer away from the first flexible layer; the hole structure layer comprises a composite insulation layer and an inorganic encapsulation layer; the composite insulation layer is arranged on the base substrate, and a blind hole is provided on the composite insulation layer and the first inorganic layer, the second flexible layer, and the second inorganic layer in the base substrate; the inorganic encapsulation layer covers an inner wall of the blind hole and the first flexible layer; the first flexible layer in the base substrate is provided with a first flexible hole, and an inorganic encapsulation hole is provided on the inorganic encapsulation layer; the stretch hole comprises the first flexible hole, the inorganic encapsulation hole, and the blind hole whose inner wall is covered by the inorganic encapsulation layer, which are mutually communicated, an inner wall of the inorganic encapsulation hole and the inorganic encapsulation layer covering an inner wall of a through hole form the inorganic material inner wall section, and an inner wall of the first flexible hole forms the organic material inner wall section.

6. The display substrate according to claim 1, wherein the base substrate comprises a first flexible layer, a first inorganic layer disposed on the first flexible layer, a second flexible layer disposed on a side of the first inorganic layer away from the first flexible layer, and a second inorganic layer disposed on a side of the second flexible layer away from the first flexible layer; the hole structure layer comprises a composite insulation layer, an organic emitting block, and an inorganic encapsulation layer; the composite insulation layer is arranged on the base substrate, and a blind hole is provided on the composite insulation layer and the first inorganic layer, the second flexible layer, and the second inorganic layer in the base substrate; the organic emitting block is arranged on the first flexible layer in the blind hole, and the inorganic encapsulation layer covers an inner wall of the blind hole and the organic emitting block; the first flexible layer in the base substrate is provided with a first flexible hole, an emitting block hole is provided on the organic emitting block, and an inorganic encapsulation hole is provided on the inorganic encapsulation layer; the stretch hole comprises the first flexible hole, the emitting block hole, the inorganic encapsulation hole, and the blind hole whose inner wall is covered by the inorganic encapsulation layer, which are mutually communicated, an inner wall of the inorganic encapsulation hole and the inorganic encapsulation layer covering an inner wall of a through hole form the inorganic material inner wall section, and an inner wall of the first flexible hole and an inner wall of the emitting block hole form the organic material inner wall section.

7. The display substrate according to claim 1, wherein the base substrate comprises a first flexible layer, a first inorganic layer disposed on the first flexible layer, a second flexible layer disposed on a side of the first inorganic layer away from the first flexible layer, and a second inorganic layer disposed on a side of the second flexible layer away from the first flexible layer; the hole structure layer comprises a composite insulation layer, an organic material block, and an inorganic encapsulation layer; the composite insulation layer is arranged on the base substrate, and a blind hole is provided on the composite insulation layer and the first inorganic layer, the second flexible layer, and the second inorganic layer in the base substrate; the organic material block is arranged on the first flexible layer in the blind hole, and the inorganic encapsulation layer covers an inner wall of the blind hole and the organic material block; the first flexible layer in the base substrate is provided with a first flexible hole, a material block hole is provided on the organic material block, and an inorganic encapsulation hole is provided on the inorganic encapsulation layer; the stretch hole comprises the first flexible hole, the material block hole, the inorganic encapsulation hole, and the blind hole whose inner wall is covered by the inorganic encapsulation layer, which are mutually communicated, an inner wall of the inorganic encapsulation hole and the inorganic encapsulation layer covering an inner wall of a through hole form the inorganic material inner wall section, and an inner wall of the first flexible hole and an inner wall of the material block hole form the organic material inner wall section.

8. The display substrate according to claim 1, wherein the base substrate comprises a first flexible layer, a first inorganic layer disposed on the first flexible layer, a second flexible layer disposed on a side of the first inorganic layer away from the first flexible layer, and a second inorganic layer disposed on a side of the second flexible layer away from the first flexible layer; the hole structure layer comprises a composite insulation layer, an organic material block, an organic emitting block, and an inorganic encapsulation layer; the composite insulation layer is arranged on the base substrate, and a blind hole is provided on the composite insulation layer and the first inorganic layer, the second flexible layer, and the second inorganic layer in the base substrate; the organic material block is arranged on the first flexible layer in the blind hole, the organic emitting block is arranged on the organic material block in the blind hole, and the inorganic encapsulation layer covers an inner wall of the blind hole and the organic emitting block; the first flexible layer in the base substrate is provided with a first flexible hole, a material block hole is provided on the organic material block, an emitting block hole is provided on the organic emitting block, and an inorganic encapsulation hole is provided on the inorganic encapsulation layer; the stretch hole comprises the first flexible hole, the material block hole, the emitting block hole, the inorganic encapsulation hole, and the blind hole whose inner wall is covered by the inorganic encapsulation layer, which are mutually communicated, an inner wall of the inorganic encapsulation hole and the inorganic encapsulation layer covering an inner wall of a through hole form the inorganic material inner wall section, and an inner wall of the first flexible hole, an inner wall of the material block hole, and an inner wall of the emitting block hole form the organic material inner wall section.

9. The display substrate according to claim 2, wherein the display structure layer comprises a light emitting structure layer disposed on the base substrate and an encapsulation layer disposed on a side of the light emitting structure layer away from the base substrate; the light emitting structure layer comprises an organic emitting layer, and the encapsulation layer comprises a first encapsulation layer, an organic encapsulation layer, and a second encapsulation layer which are stacked; the inorganic encapsulation layer comprises a first inorganic encapsulation layer and a second inorganic encapsulation layer which are stacked; the organic emitting block and the organic emitting layer are arranged in a same layer and have a same material; the first inorganic encapsulation layer and the first encapsulation layer are arranged in a same layer and have a same material; and the second inorganic encapsulation layer and the second encapsulation layer are arranged in a same layer and have a same material.

10. The display substrate according to claim 1, wherein the non-display region comprises a circuit region located at a periphery of the display region, an encapsulation region located at a periphery of the circuit region, and a bezel region located at a periphery of the encapsulation region; the stretch hole comprises any one or more of following: a stretch hole located in the circuit region, a stretch hole located in the encapsulation region, and a stretch hole located in the bezel region.

11. The display substrate according to claim 1, wherein a width of the stretch hole in the non-display region is greater than a width of the stretch hole in the display region.

12. The display substrate according to claim 11, wherein the width of the stretch hole in the display region is 5 μm to 15 μm, and the width of the stretch hole in the non-display region is 20 μm to 40 μm.

13. A display apparatus, comprising the display substrate according to claim 1.

14. A preparation method of the display substrate according to claim 1, comprising:

forming the display structure layer disposed on the base substrate in the pixel area and forming the hole structure layer disposed on the base substrate in the hole area; and forming the at least one stretch hole penetrating through the base substrate and the hole structure layer in the hole area, wherein the display substrate comprises a display region and a non-display region, and the stretch hole comprises a stretch hole in the display region and a stretch hole in the non-display region.

15. The preparation method according to claim 14, wherein the forming the hole structure layer disposed on the base substrate in the hole area, comprises:

forming a base substrate, wherein the base substrate comprises a first flexible layer, a first inorganic layer, a second flexible layer, and a second inorganic layer that are stacked, and a first inorganic opening is provided on the first inorganic layer;

forming a composite insulation layer on the base substrate, wherein a through hole or a blind hole is provided on the base substrate and the composite insulation layer; the through hole penetrates through the composite insulation layer and the base substrate, and the blind hole penetrates through the composite insulation layer and the first inorganic layer, the second flexible layer, and the second inorganic layer in the base substrate;

forming an organic emitting block at a bottom of the through hole or the blind hole, or forming an organic material block, or sequentially forming an organic material block and an organic emitting block; and forming an inorganic encapsulation layer in the through hole or the blind hole, wherein the inorganic encapsulation layer covers an inner wall of the through hole or the blind hole and covers the organic emitting block or the organic material block.

16. The preparation method according to claim 15, wherein the display structure layer comprises a light emitting structure layer disposed on the base substrate and an encapsulation layer disposed on the light emitting structure layer; the light emitting structure layer comprises an organic emitting layer, and the encapsulation layer comprises a first encapsulation layer, an organic encapsulation layer, and a second encapsulation layer which are stacked; the inorganic encapsulation layer comprises a first inorganic encapsulation layer and a second inorganic encapsulation layer which are stacked; the organic emitting block and the organic emitting layer are arranged in a same layer and are formed through a same process; the first inorganic encapsulation layer and the first encapsulation layer are arranged in a same layer and are formed through a same process; the second inorganic encapsulation layer and the second encapsulation layer are arranged in a same layer and are formed through a same process.

17. The preparation method according to claim 16, wherein the forming at least one stretch hole penetrating through the base substrate and the hole structure layer in the hole area, comprises:

etching the inorganic encapsulation layer and the organic emitting block in the through hole through a patterning process to form an emitting block hole and an inorganic encapsulation hole communicated with each other, wherein the emitting block hole is arranged on the organic emitting block and the inorganic encapsulation hole is arranged on the inorganic encapsulation layer; wherein an inner wall of the inorganic encapsulation hole and the inorganic encapsulation layer covering the inner wall of the through hole form the inorganic material inner wall section, and an inner wall of the emitting block hole forms the organic material inner wall section; or, etching the inorganic encapsulation layer and the organic material block in the through hole through a patterning process to form a material block hole and an inorganic encapsulation hole communicated with each other, wherein the material block hole is arranged on the organic emitting block and the inorganic encapsulation hole is arranged on the inorganic encapsulation layer; wherein an inner wall of the inorganic encapsulation hole and the inorganic encapsulation layer covering the inner wall of the through hole form the inorganic material inner wall section, and an inner wall of the material block hole forms the organic material inner wall section; or, etching the inorganic encapsulation layer, the organic emitting block, and the organic material block in the through hole through a patterning process to form a material block hole, an emitting block hole, and an inorganic encapsulation hole which are mutually communicated, wherein the material block hole is arranged on the organic emitting block, the emitting block hole is arranged on the organic emitting block, and the inorganic encapsulation hole is arranged on the inorganic encapsulation layer; an inner wall of the inorganic encapsulation hole and the inorganic encapsulation layer covering the inner wall of the through hole form the inorganic material inner wall section, and an inner wall of the material block hole and an inner wall of the emitting block hole form the organic material inner wall section; or, etching the inorganic encapsulation layer, the organic emitting block, and the first flexible layer in the blind hole through a patterning process to form a first flexible hole, an emitting block hole, and an inorganic encapsulation hole which are mutually communicated, wherein the first flexible hole is arranged on the first flexible layer, the emitting block hole is arranged on the organic emitting block, and the inorganic encapsulation hole is arranged on the inorganic encapsulation layer; wherein an inner wall of the inorganic encapsulation hole and the inorganic encapsulation layer covering the inner wall of the blind hole form the inorganic material inner wall section, and an inner wall of the first flexible hole and an inner wall of the emitting block hole form the organic material inner wall section; or, etching the inorganic encapsulation layer, the organic material block, and the first flexible layer in the blind hole through a patterning process to form a first flexible hole, a material block hole, and an inorganic encapsulation hole communicated with each other, wherein the first flexible hole is arranged on the first flexible layer, the material block hole is arranged on the organic material block, and the inorganic encapsulation hole is arranged on the inorganic encapsulation layer; an inner wall of the inorganic encapsulation hole and the inorganic encapsulation layer covering the inner wall of the blind hole form the inorganic material inner wall section, and an inner wall of the first flexible hole and an inner wall of the material block hole form the organic material inner wall section; or, etching the inorganic encapsulation layer, the organic emitting block, the organic material block, and the first flexible layer in the blind hole through a patterning process to form a first flexible hole, a material block hole, an emitting block hole, and an inorganic encapsulation hole communicated with each other, wherein the first flexible hole is arranged on the first flexible layer, the material block hole is arranged on the organic material block, the emitting block hole is arranged on the organic emitting block, and the inorganic encapsulation hole is arranged on the inorganic encapsulation layer; an inner wall of the inorganic encapsulation hole and the inorganic encapsulation layer covering the inner wall of the blind hole form the inorganic material inner wall section, and an inner wall of the first flexible hole, an inner wall of the material block hole, and an inner wall of the emitting block hole form the organic material inner wall section.

18. The display substrate according to claim 3, wherein the display structure layer comprises a light emitting structure layer disposed on the base substrate and an encapsulation layer disposed on a side of the light emitting structure layer away from the base substrate; the light emitting structure layer comprises an organic emitting layer, and the encapsulation layer comprises a first encapsulation layer, an organic encapsulation layer, and a second encapsulation layer which are stacked; the inorganic encapsulation layer comprises a first inorganic encapsulation layer and a second inorganic encapsulation layer which are stacked; the organic emitting block and the organic emitting layer are arranged in a same layer and have a same material; the first inorganic encapsulation layer and the first encapsulation layer are arranged in a same layer and have a same material; and the second inorganic encapsulation layer and the second encapsulation layer are arranged in a same layer and have a same material.

19. The display substrate according to claim 4, wherein the display structure layer comprises a light emitting structure layer disposed on the base substrate and an encapsulation layer disposed on a side of the light emitting structure layer away from the base substrate; the light emitting structure layer comprises an organic emitting layer, and the encapsulation layer comprises a first encapsulation layer, an organic encapsulation layer, and a second encapsulation layer which are stacked; the inorganic encapsulation layer comprises a first inorganic encapsulation layer and a second inorganic encapsulation layer which are stacked; the organic emitting block and the organic emitting layer are arranged in a same layer and have a same material; the first inorganic encapsulation layer and the first encapsulation layer are arranged in a same layer and have a same material; and the second inorganic encapsulation layer and the second encapsulation layer are arranged in a same layer and have a same material.

* * * * *